United States Patent
Buckalew et al.

(10) Patent No.: US 10,211,052 B1
(45) Date of Patent: Feb. 19, 2019

(54) SYSTEMS AND METHODS FOR FABRICATION OF A REDISTRIBUTION LAYER TO AVOID ETCHING OF THE LAYER

(71) Applicant: Lam Research Corporation, Fremont, CA (US)

(72) Inventors: Bryan L. Buckalew, Tualatin, OR (US); Stephen J. Banik, II, Portland, OR (US); Joseph Richardson, Sherwood, OR (US); Thomas A. Ponnuswamy, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/713,524

(22) Filed: Sep. 22, 2017

(51) Int. Cl.
*H01L 21/768* (2006.01)
*H01L 21/027* (2006.01)
*H01L 23/532* (2006.01)
*H01L 21/3205* (2006.01)

(52) U.S. Cl.
CPC .... *H01L 21/0273* (2013.01); *H01L 21/32051* (2013.01); *H01L 21/7688* (2013.01); *H01L 21/76873* (2013.01); *H01L 21/76879* (2013.01); *H01L 23/53228* (2013.01); *H01L 2224/0239* (2013.01); *H01L 2224/02311* (2013.01); *H01L 2224/02331* (2013.01); *H01L 2224/02335* (2013.01); *H01L 2224/05647* (2013.01)

(58) Field of Classification Search
CPC ........... H01L 21/0273; H01L 21/32051; H01L 21/76871; H01L 21/76873; H01L 21/76879; H01L 21/7688; H01L 23/5226; H01L 23/53228; H01L 23/53233; H01L 23/53238; H01L 24/03; H01L 2224/02311; H01L 2224/0233; H01L 2224/02331; H01L 2224/02335; H01L 2224/02372; H01L 2224/0239; H01L 2224/03452; H01L 2224/03462; H01L 2224/03464; H01L 2224/03618; H01L 2224/05647; H01L 2224/05655; H01L 2224/05657; H01L 2224/05683; H01L 2224/05684

See application file for complete search history.

(56) References Cited

U.S. PATENT DOCUMENTS

| | | | |
|---|---|---|---|
| 5,091,219 A | 2/1992 | Monkowski et al. | |
| 7,122,458 B2 * | 10/2006 | Cheng | H01L 23/3114 438/612 |
| 7,794,530 B2 | 9/2010 | Vaskelis et al. | |
| 7,913,644 B2 | 3/2011 | Rulkens et al. | |
| 8,314,491 B2 * | 11/2012 | Yamashita | H01L 24/11 257/737 |
| 8,703,615 B1 * | 4/2014 | Ponnuswamy | C25D 7/123 257/E21.575 |
| 8,957,319 B2 * | 2/2015 | Han | H05K 3/108 174/257 |
| 9,449,808 B2 * | 9/2016 | Buckalew | H01L 21/02052 |
| 2006/0033678 A1 | 2/2006 | Lubomirsky et al. | |

(Continued)

*Primary Examiner* — Stephen W Smoot
(74) *Attorney, Agent, or Firm* — Penilla IP, APC

(57) ABSTRACT

Systems and methods for fabrication of a redistribution layer are described. There is no deposition of a seed layer, made from copper, on top of a substrate. The lack of the seed layer avoids a need for etching the seed layer. When the seed layer is not etched, the redistribution layer, also made from copper, is not etched.

26 Claims, 17 Drawing Sheets

(56) References Cited

U.S. PATENT DOCUMENTS

| | | | |
|---|---|---|---|
| 2009/0020878 A1* | 1/2009 | Ryu | H01L 23/3114 257/773 |
| 2014/0357075 A1* | 12/2014 | Meyer | H01L 24/11 438/613 |
| 2015/0303065 A1* | 10/2015 | Buckalew | H01L 21/0273 438/474 |
| 2016/0181196 A1* | 6/2016 | Lee | H01L 21/76846 257/751 |
| 2016/0300804 A1* | 10/2016 | Omori | H01L 21/76855 |
| 2017/0005035 A1* | 1/2017 | Chen | H01L 23/3171 |
| 2017/0032977 A1* | 2/2017 | Chen | H01L 21/4857 |
| 2017/0243839 A1 | 8/2017 | Buckalew et al. | |

* cited by examiner (PECVD)

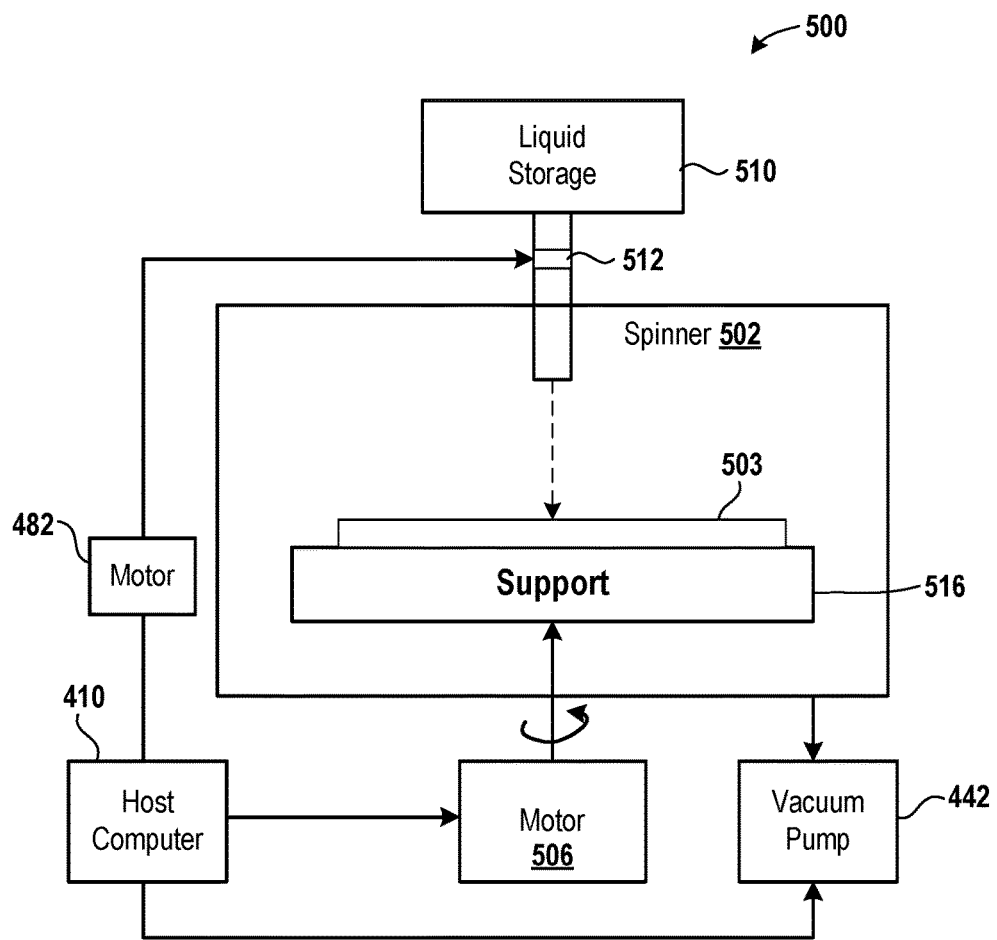
FIG. 5 (Spinner)

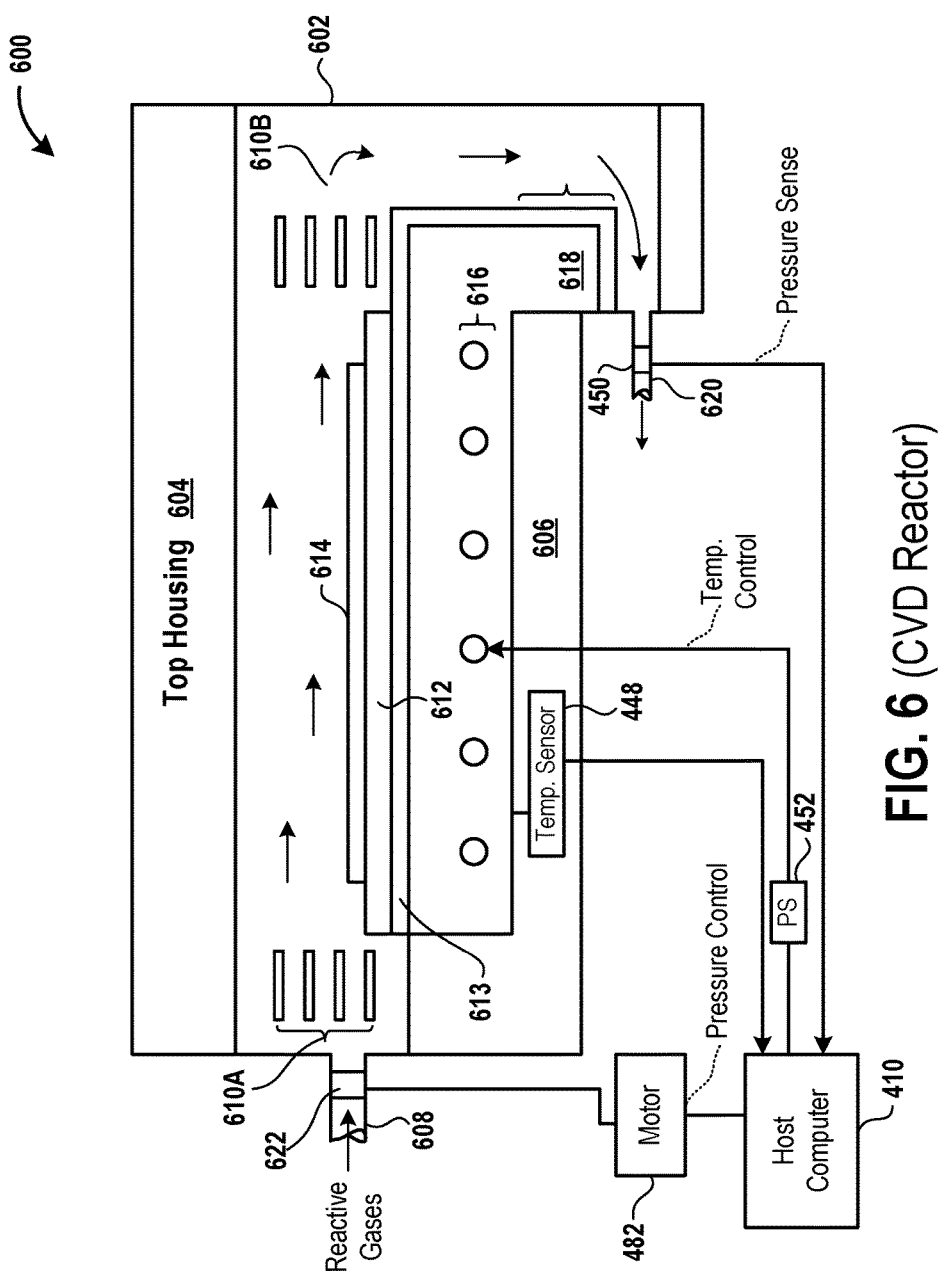
FIG. 6 (CVD Reactor)

(Electroless Deposition)

(Electroless Deposition)

(Patterning/Exposure)

(Developing a Pattern)

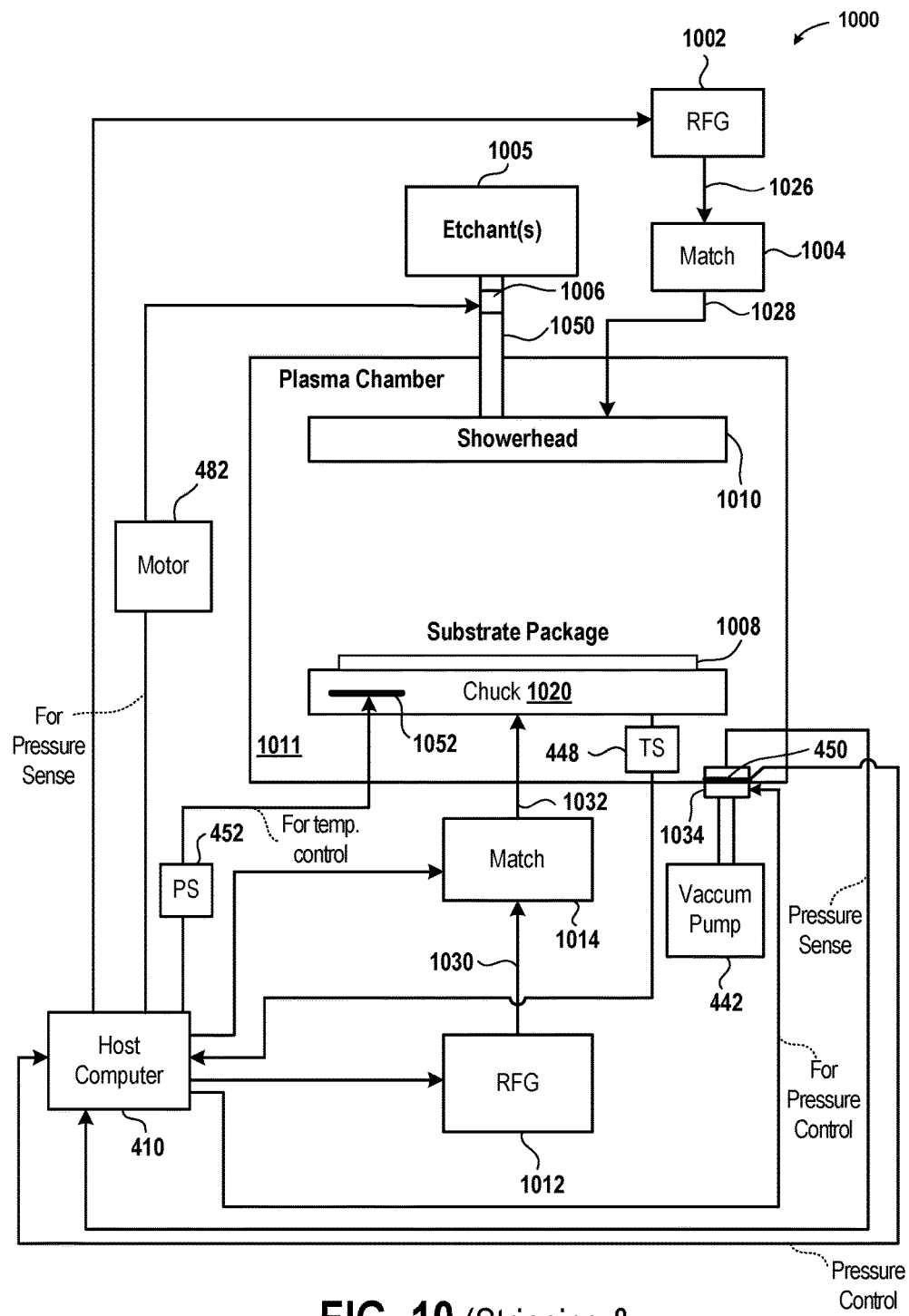
FIG. 10 (Stripping & Etching, Descum)

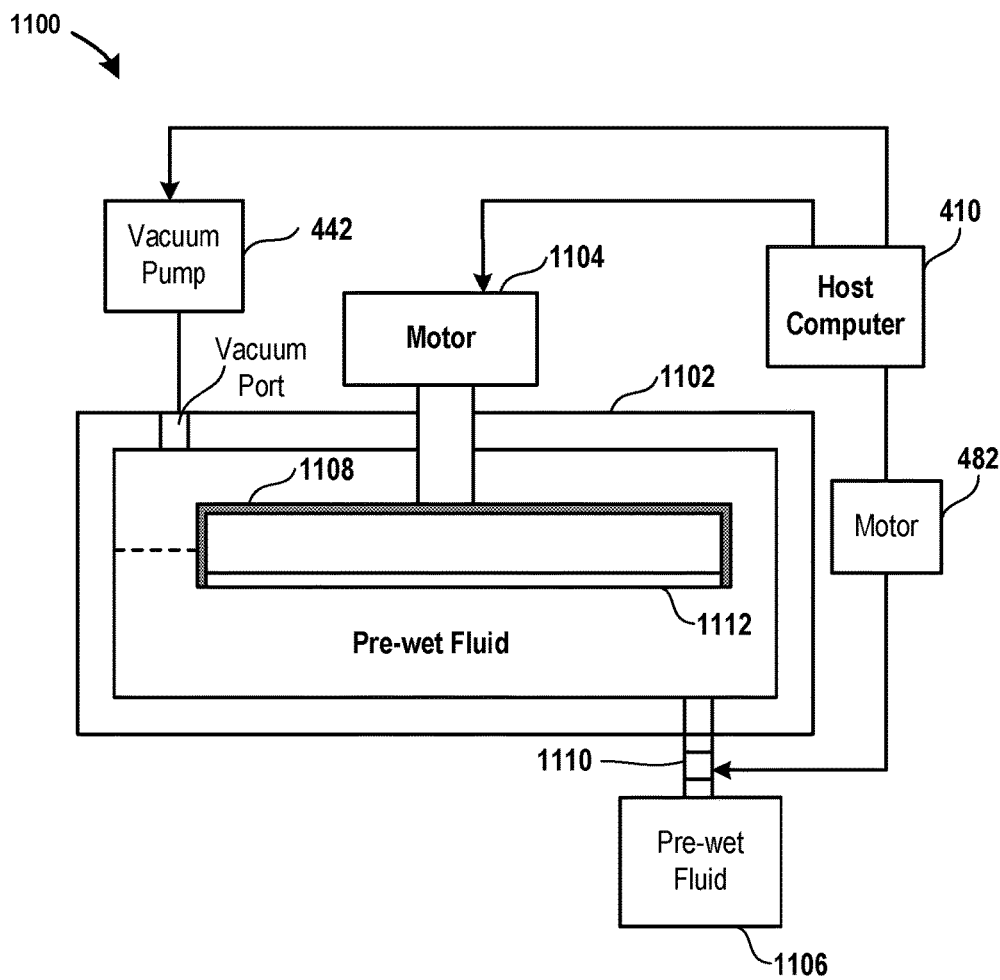
FIG. 11A (Pre-treatment)

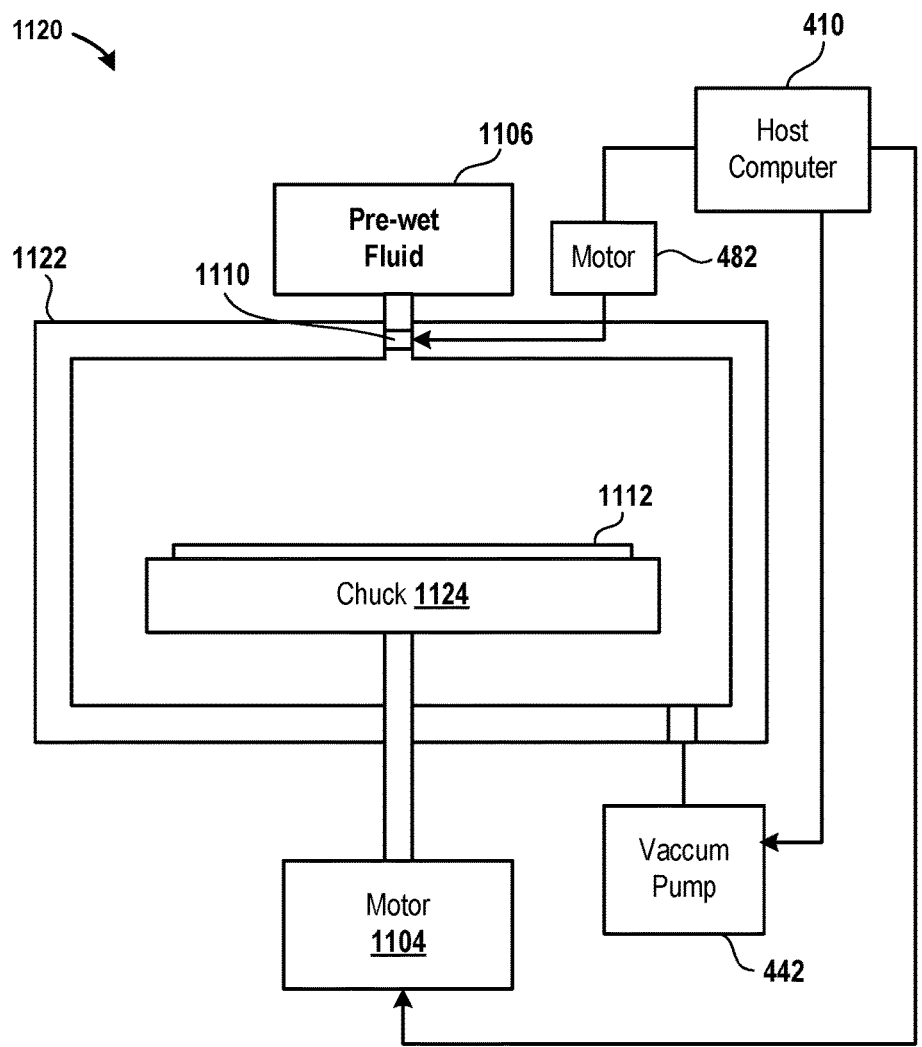
FIG. 11B (Pre-treatment)

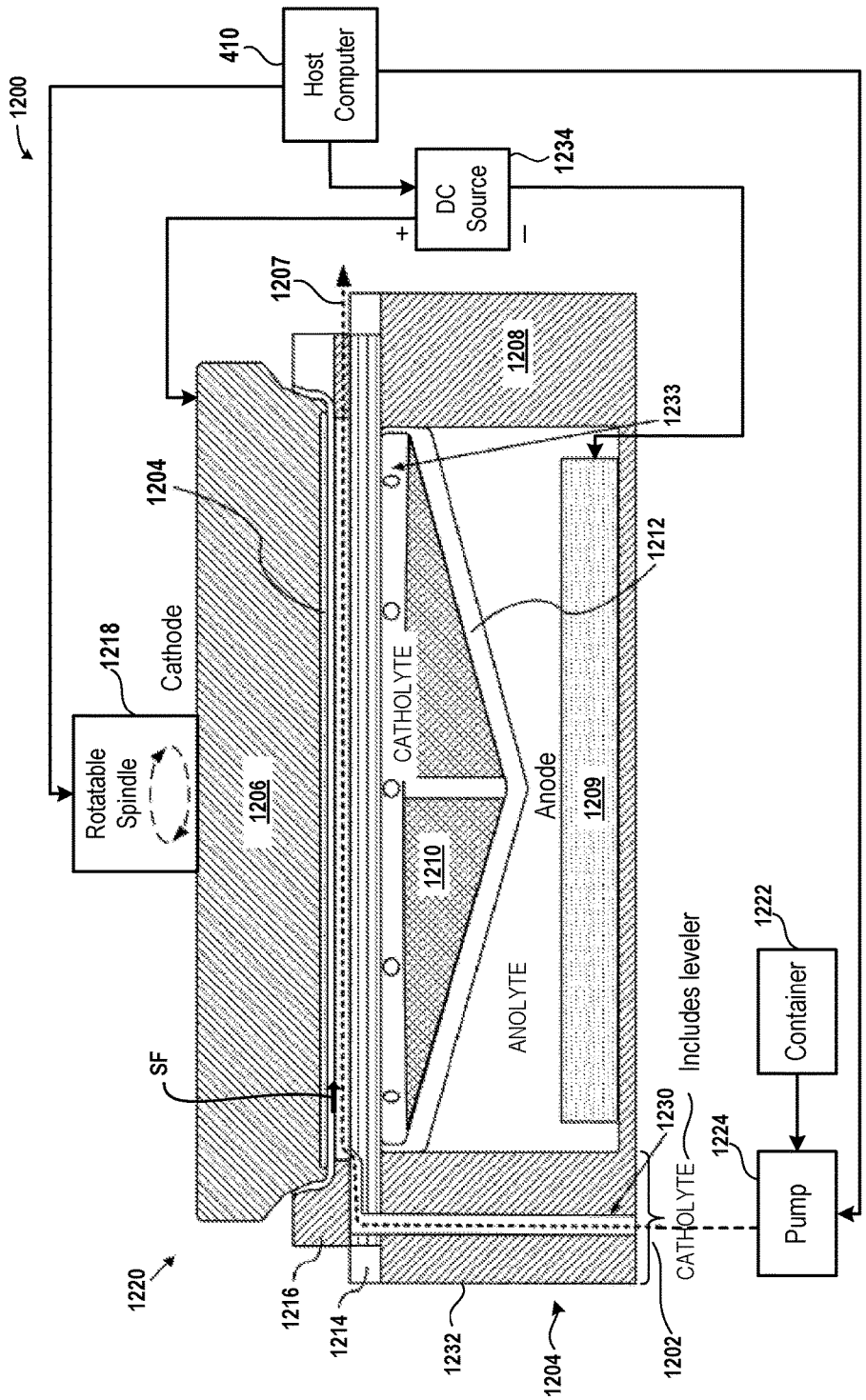
FIG. 12 (Electrodeposition)

SYSTEMS AND METHODS FOR FABRICATION OF A REDISTRIBUTION LAYER TO AVOID ETCHING OF THE LAYER

FIELD

The present embodiments relate to systems and methods for fabrication of a redistribution layer to avoid etching of the redistribution layer.

BACKGROUND

Generally, electrochemical deposition processes are used in modern integrated circuit fabrication. Metal line interconnections drive a need for increasingly sophisticated electrodeposition processes and plating tools. Much sophistication has evolved in response to a need for ever smaller current carrying lines in device metallization layers. These lines are formed by electroplating metal into very thin, high-aspect ratio trenches and vias.

Electrochemical deposition is now poised to fill a commercial need for sophisticated packaging and multichip interconnection technologies known generally and colloquially as wafer level packaging (WLP) and electrical connection technology. These technologies present their own very significant challenges due in part to the generally smaller feature sizes and low aspect ratios.

It is important that with the smaller feature sizes and finer pitches, an amount of electrical conductivity provided by the features is not compromised. It is in this context that embodiments described in the present disclosure arise.

SUMMARY

Embodiments of the disclosure provide systems and methods for fabrication of a redistribution layer to avoid etching of the redistribution layer. It should be appreciated that the present embodiments can be implemented in numerous ways, e.g., a process, an apparatus, a system, a device, or a method on a computer-readable medium. Several embodiments are described below.

High density fan-out (HDFO) wafer-level packaging (WLP) is a plating technology aimed at improving package performance, shrinking a form factor, and driving down associated costs. HDFO WLP is viewed as an alternative to a significantly more expensive through-silicon-via (TSV) technology. HDFO presents some electroplating applications of interest, such as fine pitch redistribution layer (RDL) and stacking RDLs.

Fan out (FO) technology involves a Semi-Additive-Process (SAP) where RDL lines are formed. In SAP, copper is plated in a patterned area, photoresist is stripped and a barrier and seed layer is etched from substrate. FO technology includes electrodepositing single layer copper RDLs which vary in line thickness from 10 microns to 100 microns and vary in spacing between two adjacent lines from 10 microns to 100 microns, while HDFO technology includes electrodepositing copper in much finer pitch RDLs. For example, in HDFO technology, thickness of an RDL line is 2 microns and spacing between two adjacent RDL lines is 2 microns. As another example, in HDFO technology, thickness of an RDL line ranges from 2 microns to 10 microns and spacing between two adjacent RDL lines ranges from 2 microns to 10 microns.

One fundamental challenge with the SAP process and fine pitch RDLs is that a copper etchant removes a significant amount of the RDL lines during a copper seed etch step. This results in undercut of the RDL lines, thereby significantly reducing their mechanical strength. An overall "shrink" in dimension of the RDL lines also tends to vary across a wafer and results in degraded electrical performance.

The systems and methods for fabrication of a redistribution layer, described herein, involve replacement of a copper seed layer with an alternate metal. Removal of the copper seed layer would eliminate a need for a copper seed etch operation, thus preserving the integrity of a redistribution layer that includes plated copper lines.

In one embodiment, a tungsten (W) or tungsten nitride (WN) layer is deposited using chemical vapor deposition (CVD) layer followed by deposition of a nickel boride (NiB) or a Cobalt (Co) layer. The deposition of the NiB or Co layer is performed using electroless deposition (ELD). Photoresist is then patterned across a wafer surface to form multiple photoresist features. Copper (Cu) is electrodeposited through the formed photoresist features. Segments of the photoresist are stripped from the wafer surface. The tungsten or tungsten nitride and the nickel boride or cobalt layers are then selectively etched from a field area, leaving a fine pitch copper redistribution line intact. The use of tungsten or tungsten nitride and the nickel boride or cobalt layers as a copper seed replacement for through resist plating application eliminates a need for etching of the copper seed layer.

In an embodiment, a variant from the embodiment, described above, is provided. In this embodiment, the tungsten or tungsten nitride is not deposited prior to deposition of the nickel boride or cobalt layer. This embodiment simplifies a process flow and saves additional costs. The use of the nickel boride or cobalt layer as a copper seed replacement for through resist plating application eliminates a need for etching of the copper seed layer.

In one embodiment, a Ruthenium (Ru) layer is applied to a substrate using CVD. Photoresist is then patterned across a wafer surface. A thin layer of copper is then deposited through the photoresist from a wet copper seed bath. Then, copper is electrodeposited through the photoresist to form fine pitch RDL lines. The photoresist is then stripped and the Ruthenium metal is etched from a field, leaving the fine pitch RDL lines intact. The use of Ruthenium layer in combination with the wet copper seed bath acts as a copper seed replacement eliminates a need for etching of the copper seed layer.

In an embodiment, a method for fabrication of a redistribution layer to avoid etching of the redistribution layer is described. The method includes depositing an oxide or nitride on top of a substrate to overlay a top surface of the substrate with an oxide or nitride layer. The method further includes overlaying a tungsten-based material on top of the oxide or nitride layer to form a tungsten-based layer on top of the oxide or nitride layer. The method includes applying a metal-based material to the tungsten-based layer to generate a metal-based layer on top of the tungsten-based layer. The method also includes depositing a photoresist material on top of the metal-based layer to form a photoresist layer overlaid on the metal-based layer. The method includes patterning the photoresist layer to create vias between segments of the photoresist layer. The method includes applying copper on top of the vias to generate the redistribution layer such that segments of the redistribution layer are intermittent with the segments of the photoresist layer. The method further includes stripping the segments of the photoresist layer after generating the redistribution layer. The operation of stripping is performed to access portions of the metal-based layer. The method includes etching the portions of the metal-based layers to access portions of the tungsten-based layer and to minimize the etching of the redistribution layer. The method includes etching the portions of the tungsten-based layer to minimize the etching of the redistribution layer.

In an embodiment, a method for fabrication of a redistribution layer to avoid etching of the redistribution layer is described. The method includes depositing an oxide or nitride on top of a substrate to overlay a top surface of the substrate with an oxide or nitride layer. The method further includes overlaying a metal-based material on top of the oxide or nitride layer to form a metal-based layer on top of the oxide or nitride layer. The method includes depositing a photoresist material on top of the metal-based layer to form a photoresist layer overlaid on the metal-based layer. The method includes patterning the photoresist layer to create vias between segments of the photoresist layer. The method further includes applying copper on top of the vias to generate the redistribution layer such that segments of the redistribution layer are intermittent with the segments of the photoresist layer. The method includes stripping the segments of the photoresist layer after generating the redistribution layer. The operation of stripping is performed to access portions of the metal-based layers. The method includes etching the portions of the metal-based layers to minimize etching of the redistribution layer.

In one embodiment, a method for fabrication of a redistribution layer to avoid etching of the redistribution layer is described. The method includes depositing an oxide or nitride on top of a substrate to overlay a top surface of the substrate with an oxide or nitride layer. The method further includes overlaying Ruthenium material on top of the oxide or nitride layer to form a Ruthenium layer on top of the oxide or nitride layer. The method includes depositing a photoresist material on top of the Ruthenium layer to form a photoresist layer overlaid on the Ruthenium layer. The method further includes patterning the photoresist layer to create vias between segments of the photoresist layer. The method includes applying a copper seed on top of the vias to generate a copper seed layer on top of the vias to initiate generation of the redistribution layer. The method also includes depositing bulk copper on top of the copper seed layer such that the segments of the redistribution layer are generated between the segments of the photoresist layer. The operation of depositing the bulk copper is performed to fabricate a bulk copper layer on top of the copper seed layer to fabricate the redistribution layer. The method includes stripping the segments of the photoresist layer. The operation of stripping is performed to access portions of the Ruthenium layer. The method includes etching the portions of the Ruthenium layer to minimize etching of the redistribution layer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 5 is a diagram of an embodiment of a system that includes a spinner.

FIG. 6 is a diagram of an embodiment of a chemical vapor deposition (CVD) reactor system to illustrate chemical vapor deposition.

FIG. 10 is a diagram of an embodiment of a system for illustrating a descum operation, a photoresist stripping operation, and an etching operation.

FIG. 11A is a diagram of an embodiment of a system for illustrating a pre-treatment operation.

FIG. 11B is a diagram of an embodiment of another system for illustrating a pre-treatment operation.

FIG. 12 is a diagram of an embodiment of an electrodeposition system for illustrating an electrodeposition operation.

DETAILED DESCRIPTION

The following embodiments describe systems and methods for fabrication of a redistribution layer to avoid etching of the redistribution layer. It will be apparent that the present embodiments may be practiced without some or all of these specific details. In other instances, well known process operations have not been described in detail in order not to unnecessarily obscure the present embodiments.

Figure 1A:
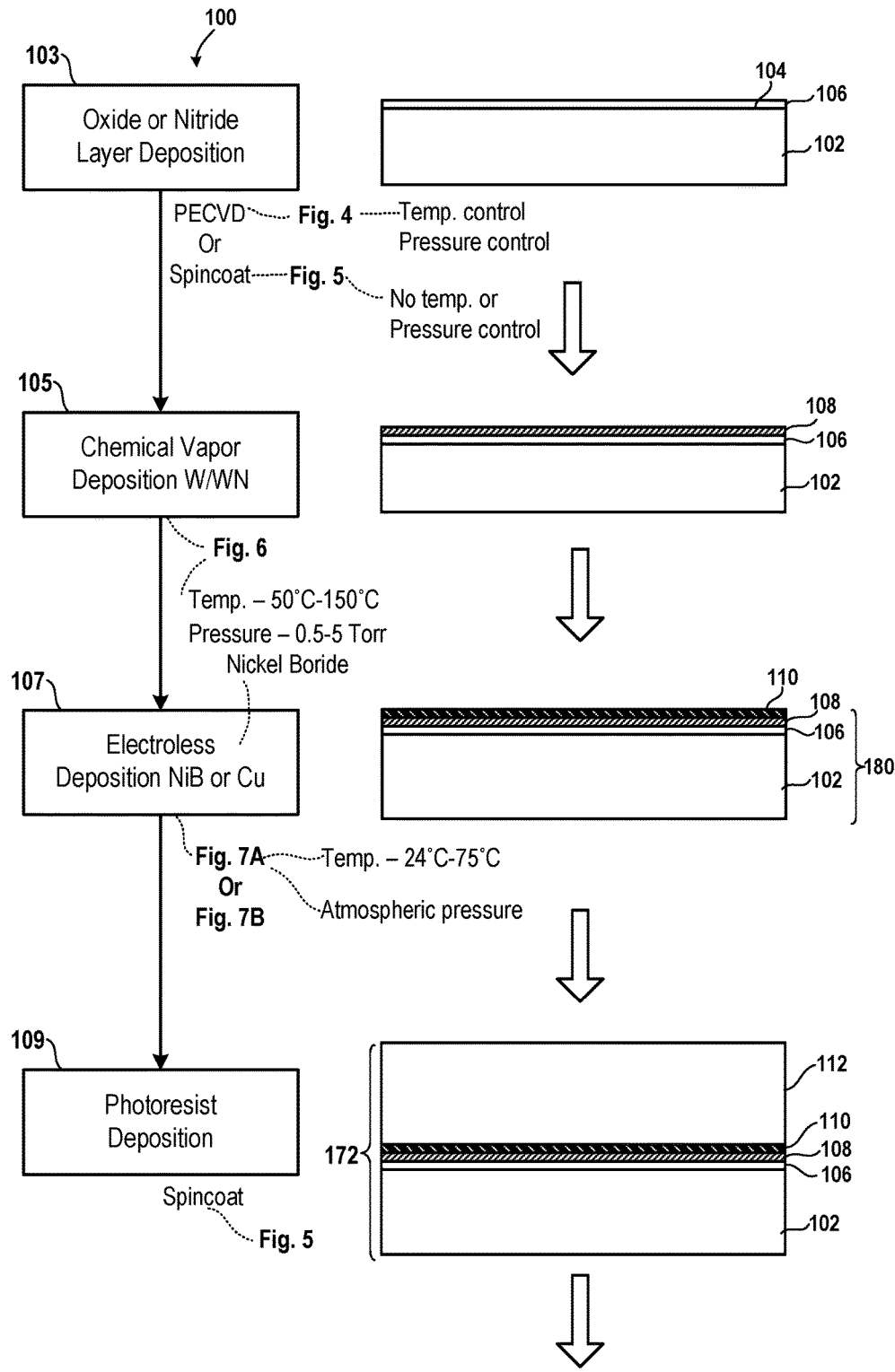
FIG. 1A is a diagram to illustrate an embodiment of a method of fabrication of a redistribution layer (RDL) while avoiding etching of the RDL.
Figure 1B:
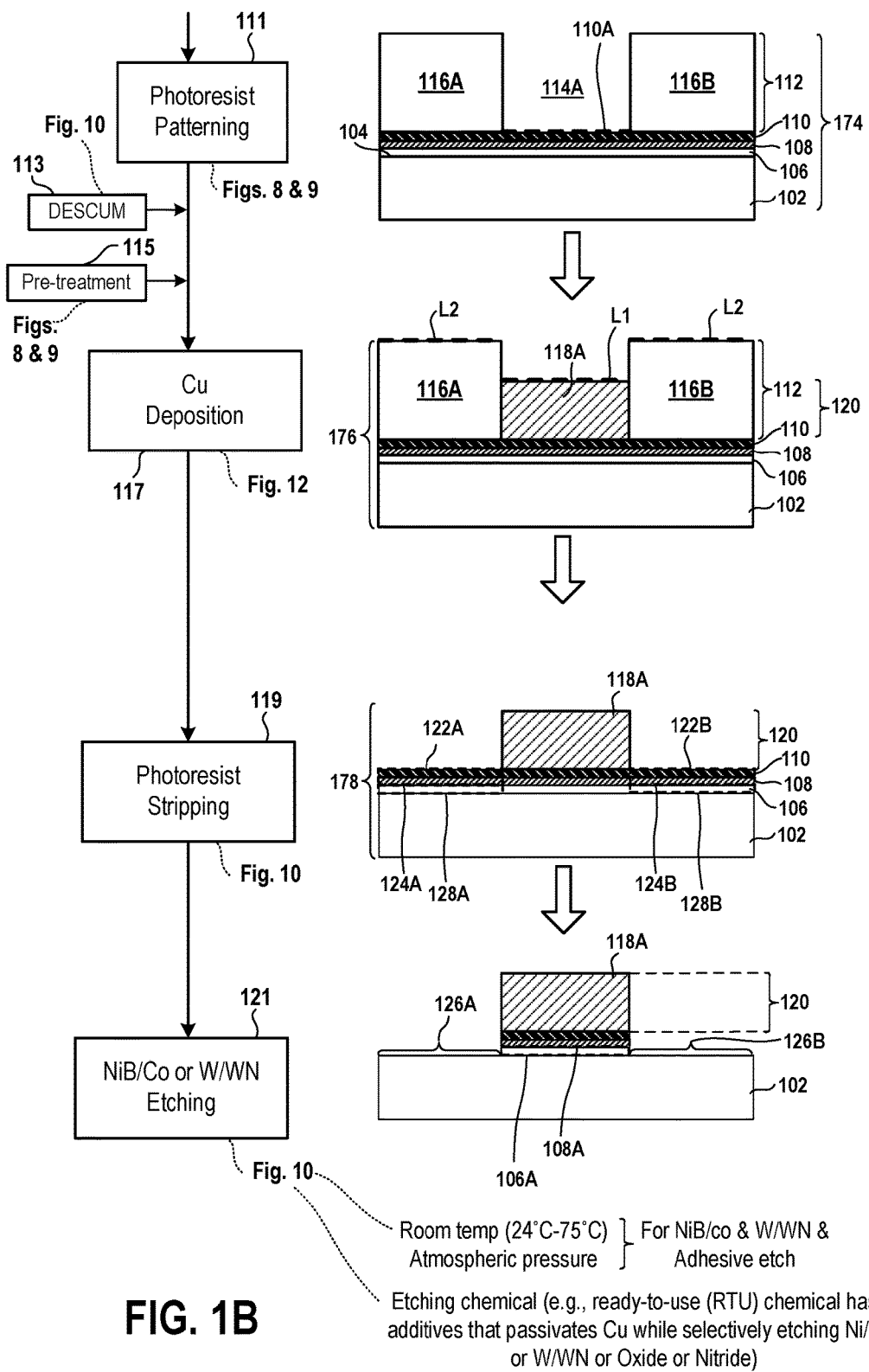
FIG. 1B is a continuation of the method of FIG. 1A.

FIGS. 1A and 1B are diagrams to illustrate a method 100 of fabrication of a redistribution layer (RDL) 120 while avoiding etching of the redistribution layer 120. The method 100 includes an operation of depositing an oxide or nitride layer 106 on top of a substrate 102. The oxide or nitride layer 106 is sometimes referred to herein as a protective layer that protects the substrate 102 from being etched which etching a layer on top of the oxide or nitride layer 106. For example, the oxide or nitride layer 106 protects the substrate 102 from being etched when a portion of a tungsten-based layer 108 is etched. An example of the nitride is silicon nitride or metal nitride and an example of the oxide is a metal oxide. The oxide or nitride is similar to damascene metallization. The oxide or nitride layer 106 is formed by depositing an oxide or nitride on a top surface 104 of the substrate 102. The oxide or nitride is deposited on the top surface 104 by using a plasma enhanced chemical vapor deposition (PECVD) chamber, described below in FIG. 4. The oxide or nitride layer 106 is formed to be coextensive with the substrate 102. For example, the oxide or nitride layer 106 is deposited over the entire top surface 104. During the deposition of the oxide or nitride on the top surface 104, a pre-defined temperature and a pre-defined pressure within the PECVD chamber are maintained.

In one embodiment, the oxide or nitride is deposited on the top surface 104 of the substrate 102 by using a spinner, which is described below in FIG. 5. During use of the spinner, there is no control of temperature or pressure within the spinner.

In the method 100, the operation 103 is followed by an operation 105 of depositing a tungsten-based material, such as tungsten (W) or tungsten nitride (WN), on top of the oxide or nitride layer 106. Tungsten nitride is an inorganic compound, which is a brown colored ceramic material that is conductive and decomposes in water. Chemical formulas of tungsten nitride include $W_2N$, $WN$, and $WN_2$. The tungsten-based material is deposited on top of the oxide or nitride layer 106 to form the tungsten-based layer 108 to cover a top surface of the oxide or nitride layer 106. The tungsten-based material is deposited so that the tungsten-based layer 108 is coextensive with the oxide or nitride layer 106. For example, the entire top surface of the oxide or nitride layer 106 is covered by the tungsten-based material to fabricate the tungsten-based layer 108.

To deposit the tungsten-based material, a chemical vapor deposition (CVD) reactor is used. The CVD reactor as illustrated below in FIG. 6. Moreover during the deposition of the tungsten-based material, a pre-defined temperature within the CVD reactor is maintained to be at 180° C. and above. For example, for the deposition of the tungsten-based material, the pre-defined temperature ranges between 180° C. and 300° C. As another example, for the deposition of the tungsten-based material, the pre-defined temperature is at 200° C. Moreover, a pre-defined pressure within the CVD reactor is maintained to be between 0.5 Torr and 5 Torr. Moreover, the tungsten-based layer 108 has a pre-defined thickness. For example, a thickness of the tungsten-based material ranges between 70 Angstroms (A) and 200 Angstroms. As another example, a thickness of the tungsten-based layer 108 ranges between 170 Angstroms and 200 Angstroms. As yet another example, a thickness of the tungsten-based layer 108 ranges between 190 Angstroms and 200 Angstroms.

Moreover, in the method 100, the operation 105 is followed by an operation 107 of depositing a metal-based material, such as nickel boride or cobalt, on a top surface of the tungsten-based layer 108. Nickel borides are inorganic compounds with a chemical formula $Ni_xB_y$, where x and y vary, x is an integer greater than zero, and y is an integer greater than zero. The metal-based material is deposited on the top surface of the tungsten-based layer 108 to form a metal-based layer 110 on top of the tungsten-based layer 108. The metal-based material is deposited so that the metal-based layer 110 is coextensive with the tungsten-based layer 108. For example, the entire top surface of the tungsten-based layer 108 is covered by the metal-based material to fabricate the metal-based layer 110.

Figure 7A:
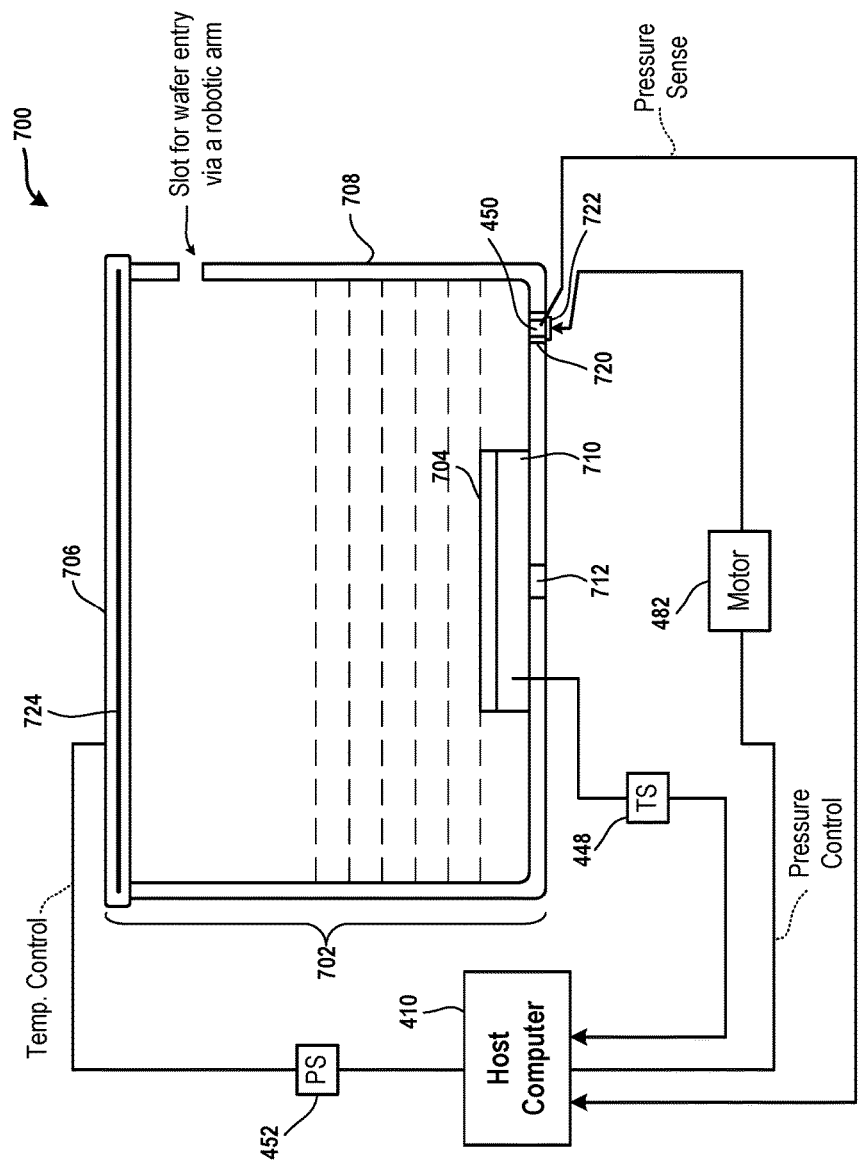
FIG. 7A is a diagram of an embodiment of an electroless deposition system to illustrate deposition of a metal-based material.
Figure 7B:
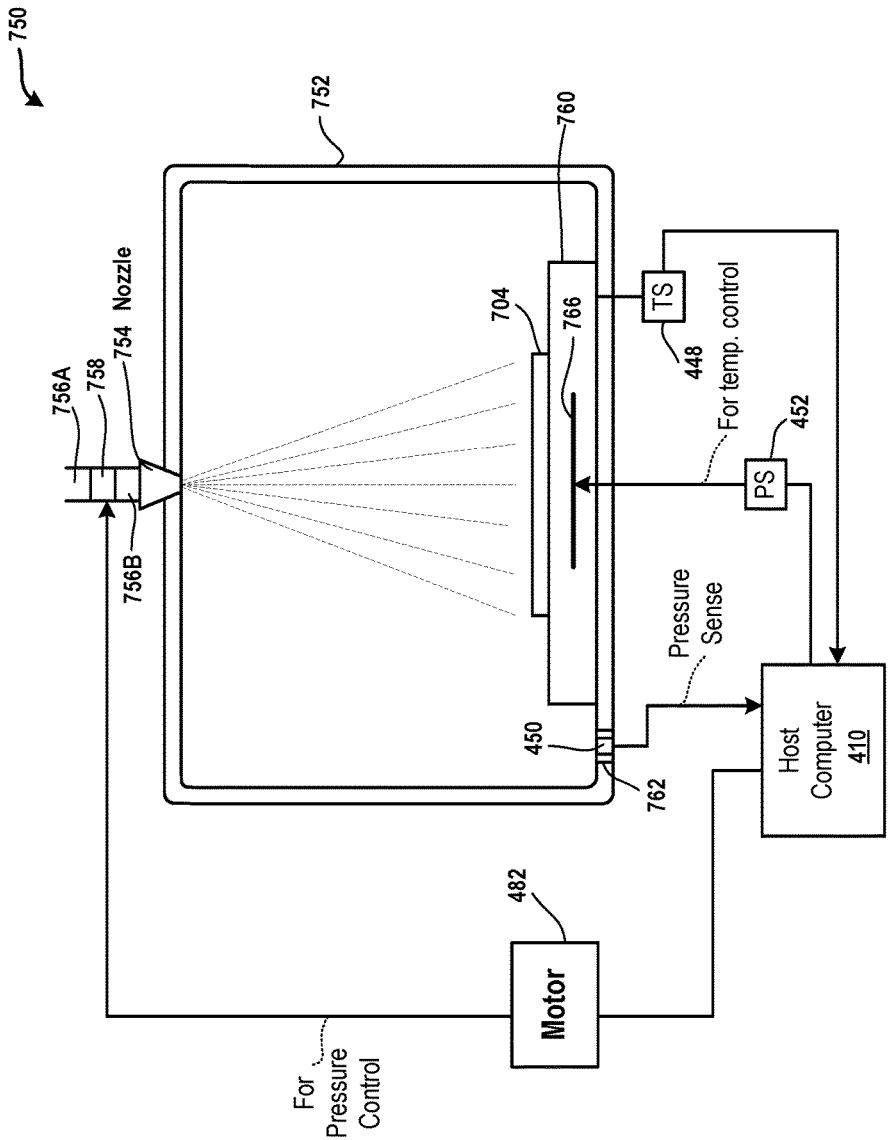
FIG. 7B is a diagram of an embodiment of another electroless deposition system to illustrate deposition of the metal-based material on a wafer.

The fabrication of the metal-based layer 110 is performed using an electroless deposition chamber, such as one illustrated in FIG. 7A or FIG. 7B. During the deposition of the metal-based material, temperature that is maintained within the electroless deposition chamber ranges between 24° C. and 75° C. To illustrate, during the deposition of the metal-based layer 110, a pre-defined temperature is maintained within the electroless deposition chamber to be at room temperature, such as between 24° C. and 26° C. Moreover, during the deposition of the metal-based material, a pre-defined pressure is maintained within the electroless deposition chamber to be between 700 Torr and 800 Torr. To illustrate, during the deposition of the metal-based layer 110, pressure within the electroless deposition chamber is atmospheric pressure atmospheric pressure, such as 760 Torr. Moreover, the metal-based layer 110 has a pre-defined thickness. For example, a thickness of the metal-based layer 110 ranges between 200 Angstroms and 1000 Angstroms. For example, a thickness of the metal-based layer 110 ranges between 500 Angstroms and 700 Angstroms. As another example, a thickness of the tungsten-based material ranges between 450 Angstroms and 650 Angstroms. It should be noted that a combination of the substrate 102, the oxide or nitride layer 106, the tungsten-based layer 108, and the metal-based layer 110 is referred to herein as a substrate package 180.

Furthermore, in the method 100, an operation 109 of depositing a photoresist material on a top surface of the metal-based layer 110 is performed. The photoresist material is deposited on the top surface of the metal-based layer 110 to form a photoresist layer 112 on top of the top surface of the metal-based layer 110. The photoresist material is deposited so that the photoresist layer 112 is coextensive with the metal-based layer 110. For example, the entire top surface of the metal-based layer 110 is covered by the photoresist material to fabricate the photoresist layer 112. The operation 109 is performed using the spinner of FIG. 5. The operation 109 is performed after performing the operation 107. It should be noted that a combination of the substrate 102, the oxide or nitride layer 106, the tungsten-based layer 108, the metal-based layer 110, and the photoresist layer 112 is referred to herein as a substrate package 172.

Moreover, an operation 111 performing a photoresist pattern on the top surface of the metal-based layer 110 is performed. The operation 111 follows the operation 109 of photoresist deposition and is a part of the method 100. The patterning of the photoresist is performed to form multiple segments, such as a segment 116A and a segment 116B of the photoresist material, and to form multiple vias, such as a via 114A, between the multiple segments. For example, the via 114A is formed between the two consecutive segments 116A and 116B of the photoresist layer 112. The vias when formed within the photoresist layer 112 become a part of the photoresist layer 112. The photoresist is patterned by using a wafer stepper, illustrated in FIG. 8, and using a wet bench, illustrated in FIG. 9. It should be noted that a combination of the substrate 102, the oxide or nitride layer 106, the tungsten-based layer 108, the metal-based layer 110, and the photoresist layer 112 that is patterned is referred to herein as a substrate package 174.

Additionally, in the method 100, a descum operation 113 is performed after performing the operation 111 of photoresist patterning. The descum operation 113 is performed to remove any residual photoresist within trenches of the vias and to improve wettability of the photoresist segments. The descum operation 113 makes the photoresist material of the photoresist segments less hydrophobic. The descum operation 113 is performed using a descum chamber, illustrated below in FIG. 10.

Furthermore, in the method 100, the descum operation 113 is followed by a pre-treatment operation 115. An example of the pre-treatment operation 115 is described in U.S. Pat. No. 8,962,085, which is incorporated by reference herein in its entirety. The pre-treatment operation 115 is a pre-wetting operation performed using a pre-treatment chamber, which is illustrated in FIG. 11A or FIG. 11B.

It should be noted that the descum operation 113 and the pre-treatment operation 115 are optional. For example, in the method 100, either the descum operation 113 or the pre-treatment operation 115, or both, are not performed.

Furthermore, in an operation 117 of the method 100, copper is deposited in the vias between the segments of the photoresist layer 112 to form a redistribution layer 120 on top surfaces of segments the metal-based layer 110. For example, copper is deposited in the via 114A between the two consecutive segments 116A and 116B on top surfaces of portions of the metal-based layer 110. To illustrate, copper is deposited on a top surface of accessible portions, such a portion 110A, of the metal-based layer 110 such that a level L1 of a top surface of segments, such as a segment 118A, of the metal-based layer 110 is lower in height than a level L2 of top surfaces of the segments of the redistribution layer 120. The accessible portions of the metal-based layer 110 are located between segments of the photoresist layer 112. For example, the portion 110A is located between the two segments 116A and 116 and is located below the segments. When copper is deposited between the segments of the photoresist layer 112, segments of copper are intermittent with the segments of the photoresist layer 112. For example, a segment of copper, such as the segment 118A, is consecutively followed by a segment, such as the segment 116B, of the photoresist layer 112. The segment of the photoresist layer 112 is consecutively followed by another segment, similar to the segment 118A, of copper. The other segment of copper is consecutively followed by another segment, similar to the segment 116B, of the photoresist layer 112.

Copper is deposited between the segments of the redistribution layer 120 by using an electrodeposition chamber, which is illustrated below in FIG. 12. The operation 117 is performed after performing the operation 115. It should be noted that a combination of the substrate 102, the oxide or nitride layer 106, the tungsten-based layer 108, the metal-based layer 110, the photoresist layer 112 that is patterned, and the redistribution layer 120 is referred to herein as a substrate package 176.

In an embodiment in which the descum operation 113 and the pre-treatment operation 115 are not performed, the operation 117 of copper electrodeposition is performed after the operation 111 of photoresist patterning.

Moreover, in an embodiment in which the descum operation 113 is performed but the pre-treatment operation 115 is not performed, the operation 117 of copper electrodeposition is performed after the operation 113. Furthermore, in an embodiment in which the pre-treatment operation 115 is performed but the descum operation 113 is not performed, the operation 117 of copper electrodeposition is performed after the operation 115.

In an operation 119 of the method 100, the segments of the photoresist layer 112 are stripped to access portions of the metal-based layer 110. For example, the segments 116A and 116B of the photoresist layer 112 are removed such that a portion 122A of the metal-based layer 110 and another portion 122B of the metal-based layer 110 are accessed. The portion 114A of the metal-based layer 110 is located between the portions 122A and 122B. Moreover, the portion 122A of the metal-based layer 110 is located below the segment 116A and the portion 122B of the metal-based layer 110 is located below the segment 116B before the operation 119 is performed. The operation 119 of photoresist stripping is performed upon performing the operation 117 of depositing the redistribution layer 120.

The operation 119 of photoresist stripping is performed using a stripping chamber, which is illustrated below in FIG. 10. The stripping chamber has the same structure and function as that of the descum chamber used to perform the descum operation 113. For example, the stripping chamber is the same as the descum chamber. As another example, another chamber, such as one illustrated in FIG. 10, is used to perform the operation 119 of photoresist stripping than a chamber, such as one illustrated in FIG. 10, used to perform the descum operation 113. It should be noted that a combination of the substrate 102, the oxide or nitride layer 106, the tungsten-based layer 108, the metal-based layer 110, and the redistribution layer 120 is referred to herein as a substrate package 178. The redistribution layer 120 includes the segments, such as the segment 118A, formed by the operation 117 of copper deposition.

In an operation 121 of the method 100, portions of the metal-based layer 110, portions of the tungsten-based layer 108 and portions of the oxide or nitride layer 106 are etched. For example, portions 122A and 122B of the metal-based layer 110 that are accessed by etching the segments 116A and 116B of the photoresist layer 112 are etched to access portions, such as portions 124A and 124B, of the tungsten-based layer 108. The portions of the tungsten-based layer 108 that are accessed are not located under the segments of the redistribution layer 120. For example, the portions 124A and 124B of the tungsten-based layer 108 are not located below the segment 118A of the redistribution layer 120. Examples of etchants of nickel boride include nitric acid ($HNO_3$), sulphuric acid ($H_2SO_4$), or a combination thereof. Examples of etchants of cobalt include phosphoric acid, hydrochloric acid, or a combination thereof. Moreover, in some embodiments, the etchants of the metal-based material include a ready-to-use (RTU) chemical that has one or more additives for increasing selectivity of the metal-based material while increasing passivity of copper to avoid the copper segments of the redistribution layer 120 from being etched while etching the portions of the metal-based layer 110. An example of such an additive for increasing the selectivity of the metal-based material includes a boron-containing halide. An example of the additive for increasing passivation of copper includes ammonium sulfate, ammonia, or copper sulfate. It should be noted that upon removal of the portions of the metal-based layer 110, a combination of the substrate 102, the oxide or nitride layer 106, the tungsten-based layer 108, remaining portions of the metal-based layer 110, and the redistribution layer 120 is referred to herein as a substrate package A. The remaining portions, such as the portion 110A, of the metal-based layer 110 are located under the segments, such as the segment 118A, of the redistribution layer 120.

As another example, the portions 124A and 124B of the tungsten-based layer 108 are etched to access portions, such as portions 128A and 128B, of the oxide or nitride layer 106. The portions of the oxide or nitride layer 106 that are accessed are not located under the segments of the redistribution layer 120. For example, the portions 128A and 128B of the oxide or nitride layer 106 are not located below the segment 118A of the redistribution layer 120. Examples of etchants of the tungsten-based material include ammonium hydroxide ($NH_4OH$), hydrogen peroxide, a solution of nitric acid and hydrofluoric acid, or a combination of two or more thereof. Moreover, in some embodiments, the etchants of the tungsten-based material include a ready-to-use chemical that has one or more additives for increasing selectivity of the tungsten-based material while increasing passivity of copper to avoid the copper segments of the redistribution layer 120 from being etched while etching the portions of the tungsten-based layer 110. An example of such an additive for increasing selectivity of the tungsten-based layer includes fluorine (F). The presence of fluorine removes tungsten in the form of exhausted tungsten hexafluoride ($WF_6$). Another example of such an additive to increase selectivity of the tungsten-based layer includes hydrocarbon or oxygen. The additive reacts with tungsten nitride to increase an etch rate for removal of the tungsten nitride. Examples of the additive for increasing passivation of the redistribution layer 120 are provided above. It should be noted that upon removal of the portions of the tungsten-based layer 108, a combination of the substrate 102, the oxide or nitride layer 106, remaining portions of the tungsten-based layer 108, remaining portions of the metal-based layer 110, and the redistribution layer 120 is referred to herein as a substrate package B. The remaining portions, such as a portion 108A, of the tungsten-based layer 108 are located under the portions, such as the portion 110A, of the metal-based layer 110.

As yet another example, the portions 128A and 128B of the oxide or nitride layer 106 are etched to access portions, such as portions 126A and 126B, of the substrate 102. The portions of the substrate 102 that are accessed are not located under the segments of the redistribution layer 120. For example, the portions 126A and 126B of the substrate 102 are not located below the segment 118A of the redistribution layer 120. Examples of etchants of the oxide or nitride include acids, such as nitric acid, sulfuric acid, hydrofluoric acid, or a combination of two or more thereof. Moreover, in some embodiments, the etchants of the oxide or nitride include a ready-to-use chemical that has the one or more additives, described above, for increasing passivity of copper to avoid the copper segments of the redistribution layer 120 from being etched while etching the portions of the oxide or nitride layer 106. Once the portions of the oxide or nitride layer 106 are etched, remaining portions, such as a portion 106A, of the oxide or nitride layer 106 are located under the portions, such as the portion 108A, of the tungsten-based layer 108.

The operation 121 of etching the metal-based layer 110, the tungsten-based layer 108, and the oxide or nitride layer 106 is performed using an etching chamber, illustrated in FIG. 10 below. The etching chamber has the same structure and function as that of the descum chamber used to perform the descum operation 113. For example, the etching chamber is the same as the descum chamber. As another example, another chamber, such as one described in FIG. 10, is used to perform the operation 121 of etching portions of the metal-based layer 110, the tungsten-based layer 108, and the oxide or nitride layer 106 than a chamber, such as one described in FIG. 10, used to perform the descum operation 113.

In some embodiments, one chamber is used to etch the metal-based layer 110, another chamber is used to etch the tungsten-based layer 108, and yet another chamber is used to etch the oxide or nitride layer 106. Each of the three chambers has the same structure and function as one described in FIG. 10.

During the operation 121, a pre-defined temperature is maintained within the etching chamber illustrated in FIG. 10. For example, a temperature ranging between 24 and 75 degrees centigrade is maintained in the etching chamber. As another example, a room temperature is maintained in the etching chamber. Moreover, during the operation 121, a pre-defined pressure, such as the atmospheric pressure, is maintained in the etching chamber.

Figure 2A:
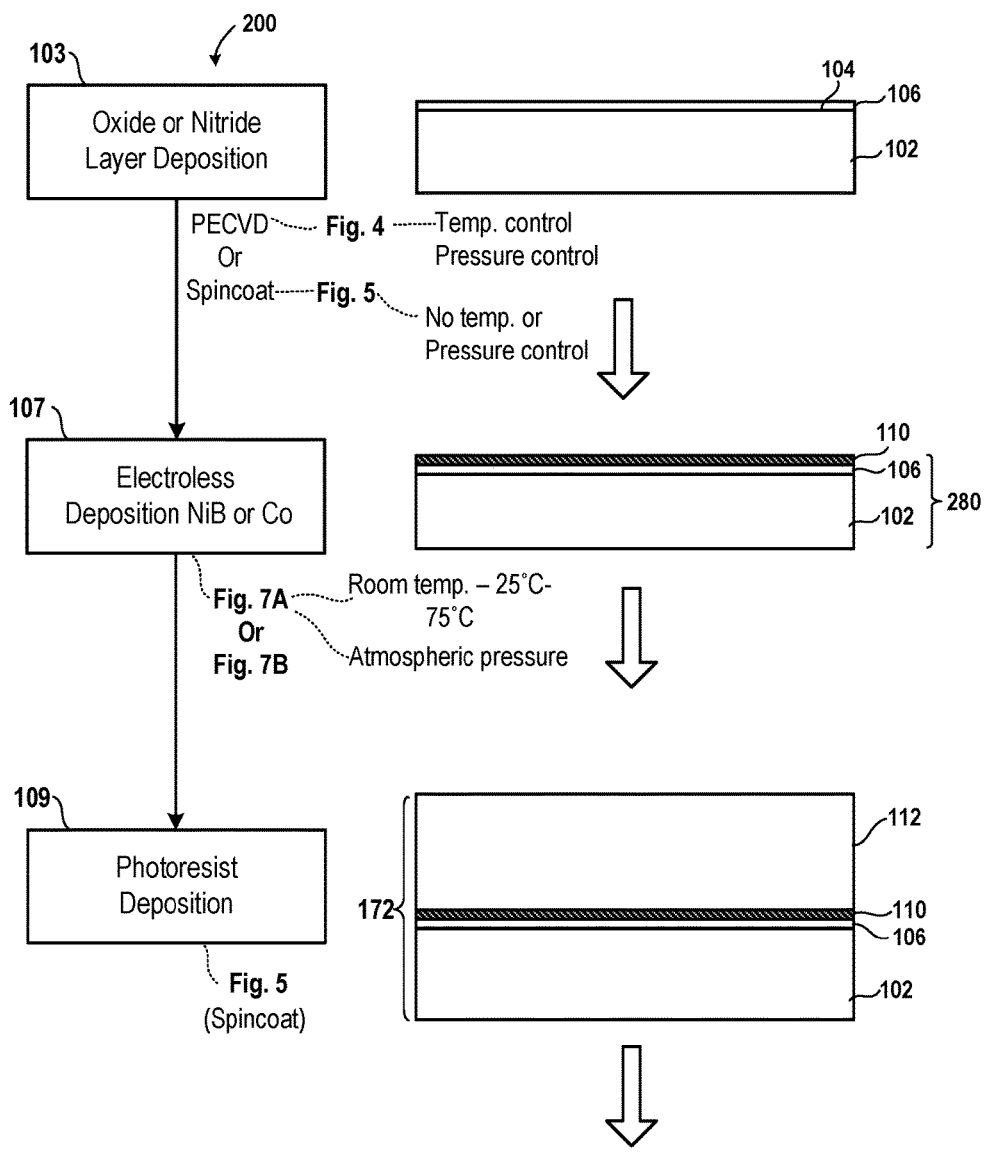
FIG. 2A is a diagram to illustrate an embodiment of another method of fabrication of an RDL while avoiding etching of the RDL.
Figure 2B:
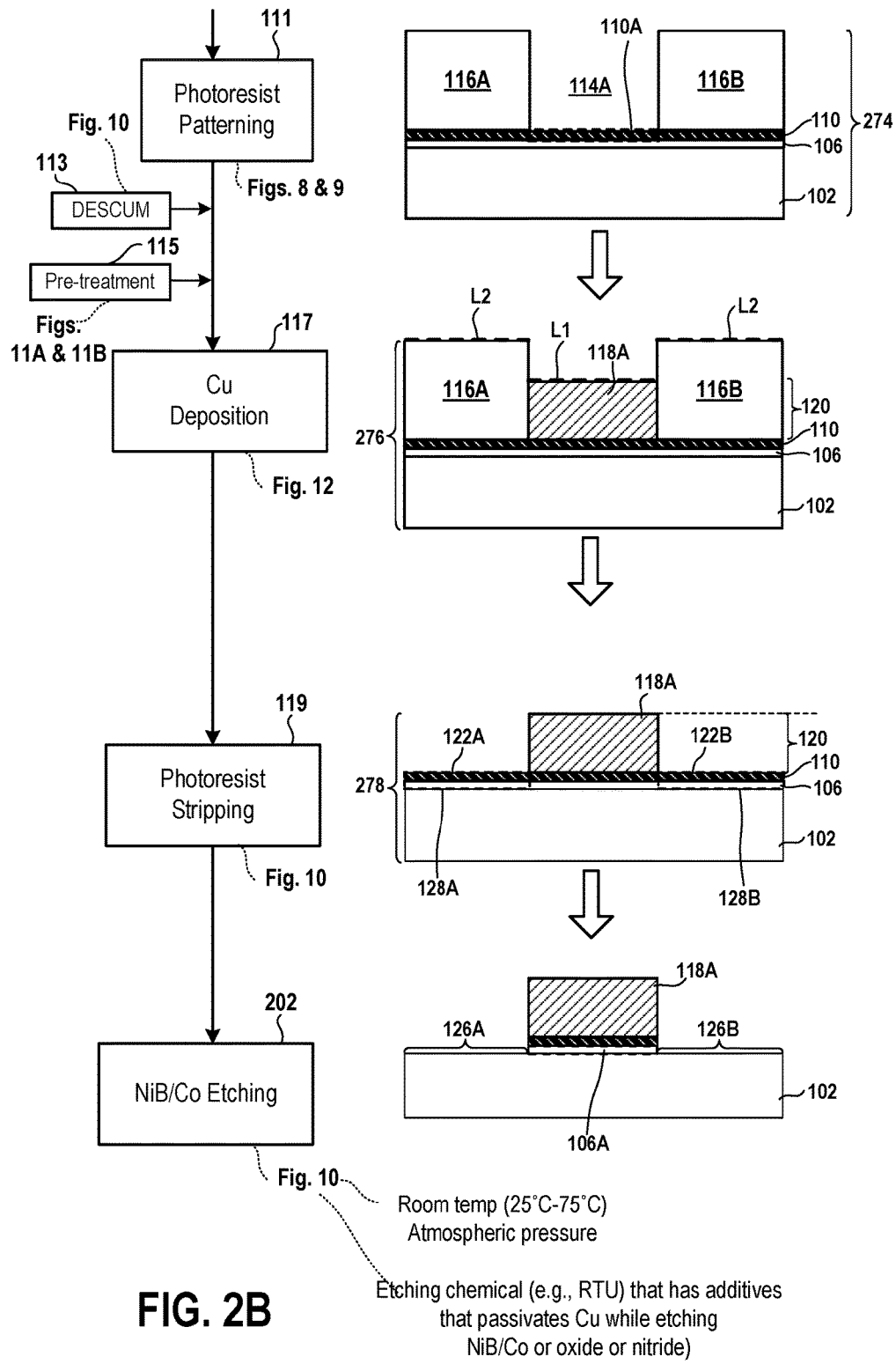
FIG. 2B is a continuation of the method of FIG. 2A.

FIGS. 2A and 2B are diagrams of an embodiment of another method 200 of fabrication of the redistribution layer 120 while avoiding etching of the redistribution layer 120. The method 200 is the same as to method 100 except that the operation 105 of deposition of the tungsten-based material is not performed. Instead, the metal-based layer 110 is deposited on the top surface of the oxide or nitride layer 106. Moreover, instead of performing the operation 121 including etching of the tungsten-based layer 108, the metal-based layer 110 and the oxide or nitride layer 106 are etched in an operation 202 of the method 200. In the method 200, the operation 107 of depositing the metal based layer 110 is performed following the operation 103 of depositing the oxide or nitride layer 106 on top of the substrate 102 and before performing the operation 109 of the photoresist deposition. The metal based-layer 110 is deposited on the top surface of the oxide or nitride layer 106 without the intermediate tungsten-based layer 108. The metal-based material is deposited so that the metal-based layer 110 is coextensive with the oxide or nitride layer 106. For example, the entire top surface of the oxide or nitride layer 106 is covered by the metal-based material to fabricate the metal-based layer 110. The oxide or nitride layer 106 creates a protective layer between the substrate 102 and the metal-based layer 110. When a portion of the metal-based layer 110 is etched, the substrate 102 is protected by the oxide or nitride layer 106 from being etched.

It should be noted that a combination of the substrate 102, the oxide or nitride layer 106, and the metal-based layer 110 is referred to herein as a substrate package 280. It should further be noted that a combination of the substrate 102, the oxide or nitride layer 106, the metal-based layer 110, and the photoresist layer 112 is referred to herein as a substrate package 272. Moreover, it should be noted that a combination of the substrate 102, the oxide or nitride layer 106, the metal-based layer 110, and the photoresist layer 112 that is patterned is referred to herein as a substrate package 274. Furthermore, it should be noted that a combination of the substrate 102, the oxide or nitride layer 106, the metal-based layer 110, the photoresist layer 112 that is patterned, and the redistribution layer 120, is referred to herein as a substrate package 276. It should also be noted that a combination of the substrate 102, the oxide or nitride layer 106, the metal-based layer 110, and the redistribution layer 120, is referred to herein as a substrate package 278. It should be noted that a combination of the substrate 102, the oxide or nitride layer 106, remaining portions of the metal-based layer 110 after performing a part of the operation 202 to remove the portions of the metal-based layer 110, and the redistribution layer 120, is referred to herein as a substrate package C. The remaining portions, such as the portion 110A, of the metal-based layer 110 are located under the segments, such as the segment 118A, of the redistribution layer 120.

In the operation 202, the portions of the metal-based layer 110 are etched to access the portions of the oxide or nitride layer 106. For example, the portions 122A and 122B of the metal-based layer 110 are etched to access top surfaces of the portions 128A and 128B of the oxide or nitride layer 106. Moreover, in the operation 202, the portions of the oxide or nitride layer 106 are etched to access the portions of the substrate 102. For example, the portions 128A and 128B of the oxide or nitride layer 106 are etched to access top surfaces of the portions 126A and 126B of the substrate 102. When the portions of the oxide or nitride layer 106 are etched, remaining portions, such as the portion 106A, of the oxide or nitride layer 106 are located under the portions, such as the portion 110A, of the metal-based layer 110.

Figure 3A:
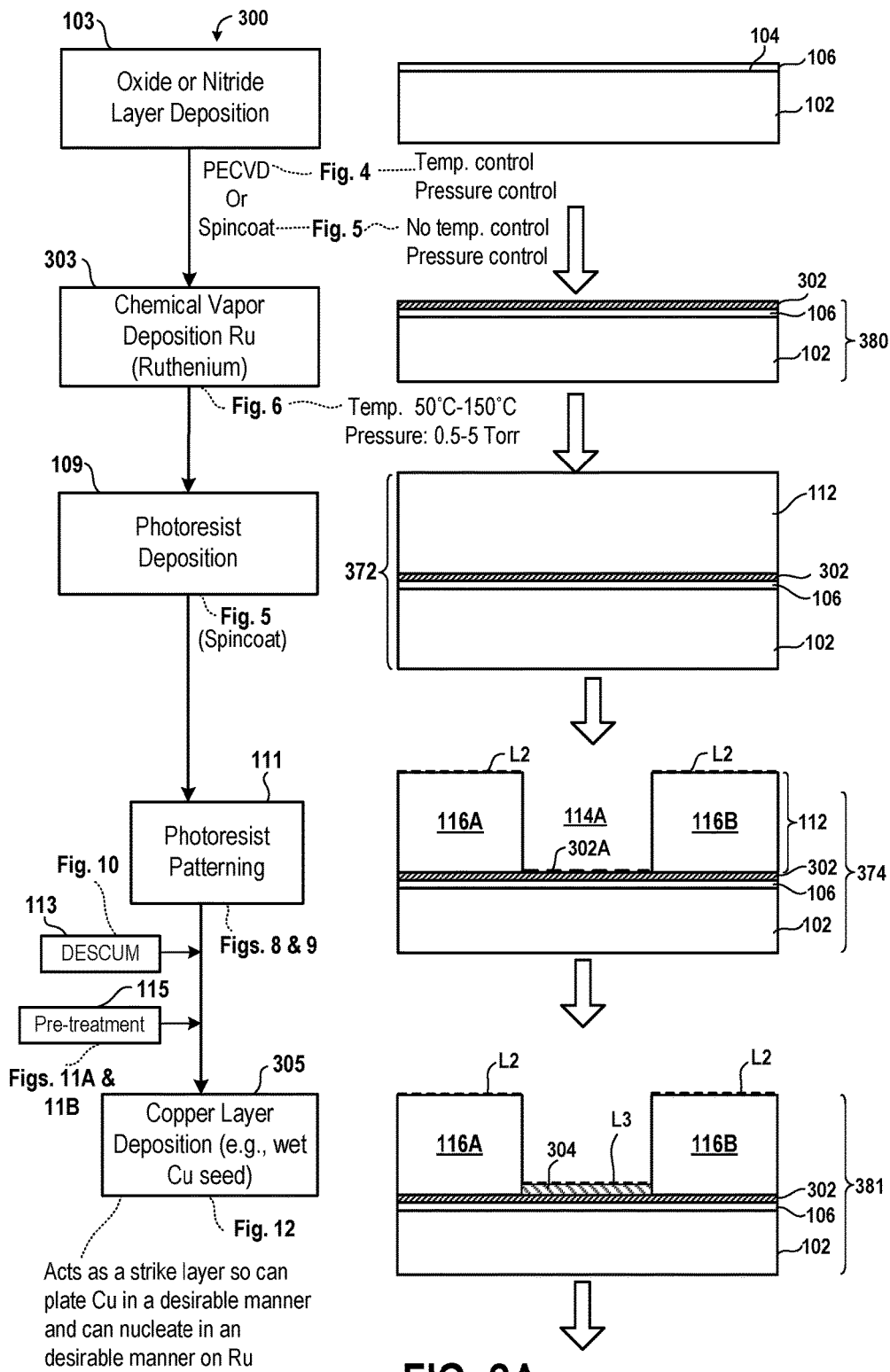
FIG. 3A is a diagram to illustrate an embodiment of another method of fabrication of an RDL while avoiding etching of the RDL.
Figure 3B:
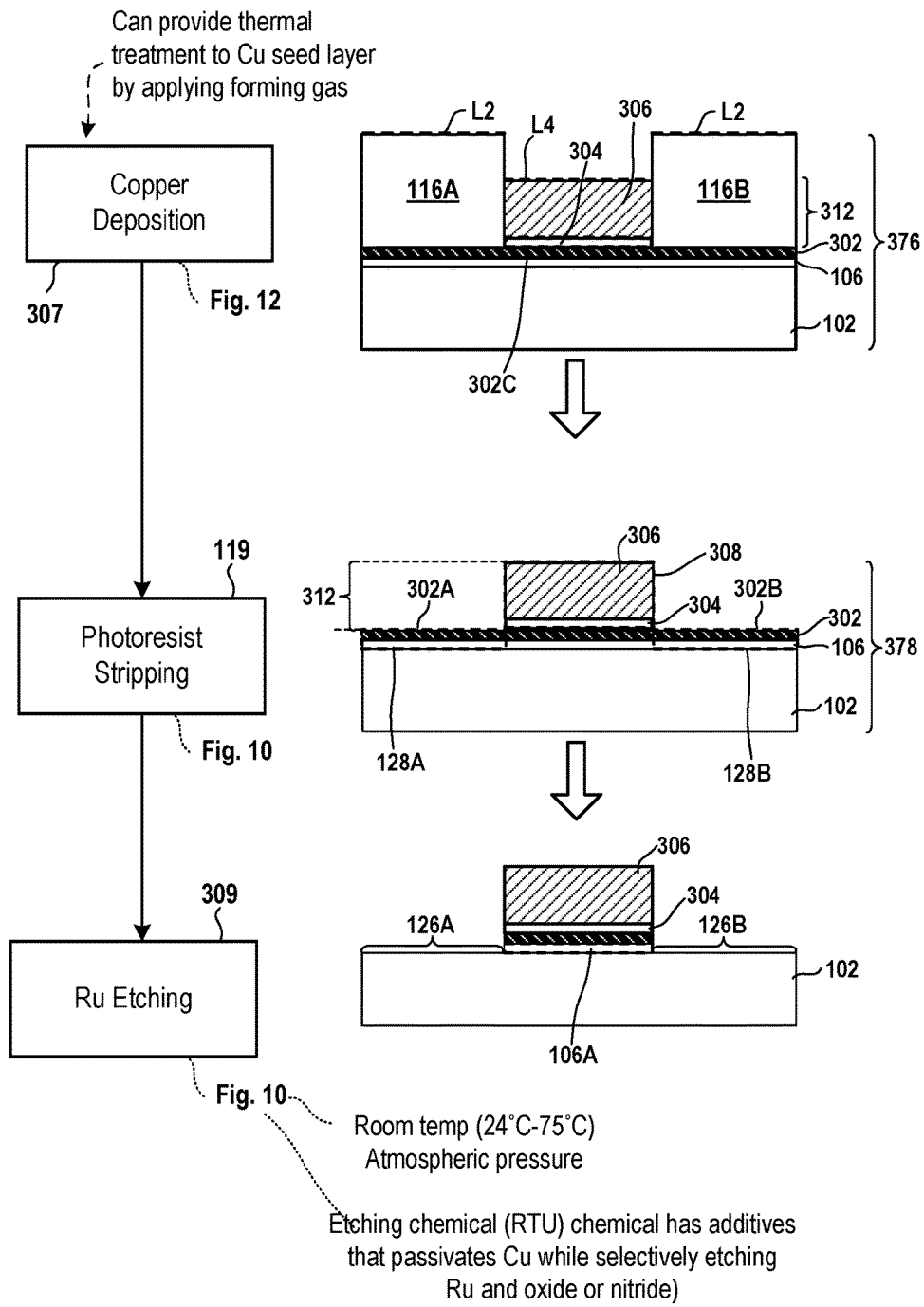
FIG. 3B is a continuation of the method of FIG. 3A.

FIGS. 3A and 3B are diagrams used to illustrate yet another method 300 of fabrication of a redistribution layer 312 while avoiding etching of the redistribution layer 312. The method 300 is the same as the method 200 except that in the method 300, instead of the operation 107 of depositing the metal-based layer 110, an operation 303 of depositing Ruthenium (Ru) is performed. Ruthenium is a rare transition metal belonging to the platinum group of the chemical periodic table. Ruthenium is inert to most other chemicals. Moreover, in the method 300, instead of performing the operation 117 of depositing copper, an operation 305 of depositing a copper seed layer 304 is performed followed by an operation 307 of depositing a bulk copper layer 306. Furthermore, in the method 300, instead of performing the etching operation 202, an etching operation 309 of etching a Ruthenium layer 302 and etching the oxide or nitride layer 106 is performed.

In the operation 303, Ruthenium is deposited on the top surface of the oxide or nitride layer 106. For example, Ruthenium is overlaid on the top surface of the oxide or nitride layer 106 to cover the top surface of the oxide or nitride layer 106 to further form the Ruthenium layer 302 on top of the oxide or nitride layer 106. Ruthenium is deposited so that the Ruthenium layer 302 is coextensive with the oxide or nitride layer 106. For example, the entire top surface of the oxide or nitride layer 106 is covered by Ruthenium to fabricate the Ruthenium layer 302.

The CVD reactor illustrated in FIG. 6 is used to deposit the Ruthenium layer 302. Moreover, during the deposition of the Ruthenium layer 302, a pre-defined temperature ranging between 100 and 300 degrees centigrade is maintained within the CVD reactor. For example, during the deposition of the Ruthenium layer 302, the pre-defined temperature of 200 degrees centigrade is maintained within the CVD reactor. As another example, during the deposition of the Ruthenium layer 302, the pre-defined temperature ranging between 180 and 220 degrees centigrade is maintained within the CVD reactor. In addition, during the deposition of the Ruthenium layer 302, a pre-defined pressure, such as one ranging between 0.5 Torr and 5 Torr, is sustained within the CVD reactor. Moreover, the Ruthenium layer 302 has a pre-defined thickness. For example, a thickness of the Ruthenium layer 302 ranges between 5 nanometers and 10 nanometers. For example, a thickness of the Ruthenium layer 302 ranges between 7 nanometers and 9 nanometers. As another example, a thickness of the Ruthenium layer 302 is 8 nanometers. A combination of the substrate 102, the oxide or nitride layer 106, and the Ruthenium layer 302 is referred to herein as a substrate package 380.

In the operation 109, the photoresist layer 112 is deposited on a top surface of the Ruthenium layer 302. The photoresist material is deposited so that the photoresist layer 112 is coextensive with the Ruthenium layer 302. For example, the entire top surface of the Ruthenium layer 302 is covered by the photoresist material to fabricate the photoresist layer 112. When the photoresist layer 112 is patterned in the operation 111, top surfaces of portions, such as a portion 302A, of the Ruthenium layer 302 are accessed. It should be noted that a combination of the substrate 102, the oxide or nitride layer 106, the Ruthenium layer 302, and the photoresist layer 112 is referred to herein as a substrate package 372. Moreover, it should be noted that a combination of the substrate 102, the oxide or nitride layer 106, the Ruthenium layer 302, and the photoresist layer 112 that is patterned is referred to herein as a substrate package 374.

In the operation 305, the copper seed layer 304 is deposited within the vias formed within the photoresist layer 112. For example, the copper seed layer 304 is fabricated within the vias between the segments of the photoresist layer 112. To illustrate, the copper seed layer 304 is deposited on the via 114A located between the segments 116A and 116B. The copper seed layer 304 is deposited to a level L3 that is lower than the level L1 illustrated in FIGS. 1B and 2B. The copper seed layer 304 is deposited as a strike layer to nucleate copper on top of the Ruthenium layer 302. The operation 305 is performed following the operation 111 of photoresist patterning 111. In the embodiments in which the descum operation 113 or the pre-treatment operation 115, or both, are performed, the operation 305 is performed following the operation 113 or the operation 115, or both the operations. The copper seed layer 304 is deposited in the electrodeposition chamber illustrated in FIG. 12. A combination of the substrate 102, the oxide or nitride layer 106, the Ruthenium layer 302, segments, such as the segments 116A and 116B, of the photoresist layer 112, and the copper seed layer 304, is referred to herein as a substrate package 381.

The copper seed layer 304 is a segment between two consecutive segments of the photoresist layer 112. Additional segments, such as the segment illustrated by the copper seed layer 304, are formed between additional consecutive segments of the photoresist layer 112. For example, an additional segment, such as the segment illustrated by the copper seed layer 304, is deposited between the segment 116B and a consecutive segment that follows the segment 116B.

Moreover, during the operation 307, bulk copper is deposited on a top surface of the copper seed layer 304 to form the bulk copper layer 306. The bulk copper is deposited in the vias between the segments of the photoresist layer 112. For example, the bulk copper is deposited in the via 114A between the segments 116A and 116B. The bulk copper layer 306 has a level L4, which is lower than the level L2. The bulk copper layer 306 is fabricated between the levels L3 and L4. The copper seed layer 304 and the bulk copper layer 306 form the redistribution layer 312 on top of portions, such as a portion 302C, of the Ruthenium layer 302. For example, segments, such as a segment 308, of the redistribution layer 312 are formed in the vias of the photoresist layer 112. The portions, such as the portion 302C, of the Ruthenium layer 302 are located under the copper seed layer 304. It should be noted that a combination of the substrate 102, the oxide or nitride layer 106, the Ruthenium layer 302, the redistribution layer 312, and the photoresist layer 112 that is patterned is referred to herein a substrate package 376.

The bulk copper layer 306 is a segment between two consecutive segments of the photoresist layer 112. Additional segments, such as the segment illustrated by the bulk copper layer 306, are formed between additional consecutive segments of the photoresist layer 112. For example, an additional segment, such as the segment illustrated by the bulk copper layer 306, is deposited between the segment 116B and a consecutive segment that follows the segment 116B.

In one embodiment, after depositing the copper seed layer 304 and before deposition the bulk copper layer 306, the copper seed layer 304 is annealed. For example, a thermal treatment is performed on the copper seed layer 304 by applying a forming gas to the copper seed layer 304. The forming gas is a mixture of nitrogen and hydrogen. The forming gas is applied as a process gas in the chamber of FIG. 10. For example, instead of an etchant, the forming gas is applied in the descum chamber of FIG. 10.

In the operation 119, the segments of the photoresist layer 112 are stripped to access portions, such as a portion 302A and 302B, of the Ruthenium layer 302. The portion 302C is located between the portions 302A and 302B. Moreover, in the operation 309, the portions, such as the portion 302A and 302B, of the Ruthenium layer 302 are etched to access the portions, such as the portions 128A and 128B, of the oxide or nitride layer 106 and the portions of the oxide or nitride layer 106 are etched to access the portions, such as the portion 126A and 126B, of the substrate 102. For example, the segments 302A and 302B of the Ruthenium layer 302 that are accessed by etching the segments 116A and 116B of the photoresistor layer 112 are etched to access the portions 128A and 128B of the oxide or nitride layer 106. The portions of the Ruthenium layer 302 that are accessed are not located under the segments of the redistribution layer 312. As an example, the portions 302A and 302B of the Ruthenium layer 302 are not located under the segment 308 of the redistribution layer 312. Examples of etchants of Ruthenium include hydrochloric acid, nitric acid, or sulfuric acid, or a combination thereof. Moreover, in some embodiments, the etchants of the Ruthenium layer 302 include a ready-to-use chemical that has one or more additives for increasing selectivity of Ruthenium while increasing passivity of copper to avoid the copper segments of the redistribution layer 312 from being etched while etching the portions of the Ruthenium layer 302. An example of such an additive for increasing the selectivity of the Ruthenium layer 302 includes chlorine. Examples of the additive for increasing passivation of copper are described above. The portions, such as the portions 302A and 302B of the Ruthenium layer 302 and the portions, such as the portions 128A and 128B, of the oxide or nitride layer 106 that are accessed are not under the copper seed layer 304. After etching the portions, such as the portions 302A and 302B, of the Ruthenium layer 302, remaining portions, such as the portion 302C, are located under the copper seed layer 304. Similarly, after etching the portions, such as the portions 128AA and 128B, of the oxide or nitride layer 106, remaining portions, such as the portion 106A, are located under the copper seed layer 304.

The operation 309 of etching the Ruthenium layer 302 and the oxide or nitride layer 106 is performed using the etching chamber of FIG. 10. The etching chamber has the same structure and function as that of the descum chamber used to perform the descum operation 113. As an example, another chamber, such as one illustrated in FIG. 10, is used to perform the operation 309 of etching the Ruthenium layer 302 and the oxide or nitride layer 106 than a chamber, such as one illustrated in FIG. 10, used to perform the descum operation 113. It should be noted that a combination of the substrate 102, the oxide or nitride layer 106, the Ruthenium layer 302, and the redistribution layer 312 is referred to as a substrate package 378. Moreover, it should be noted that a combination of the substrate 102, the oxide or nitride layer 106, remaining portions of the Ruthenium layer 302 after etching the portions, such as the portions 302A and 302B, of the Ruthenium layer 302, and the redistribution layer 312 is referred to as a substrate package D.

In some embodiments, one chamber, such as one illustrated in FIG. 10, is used to etch the Ruthenium layer 302 and another chamber, such as one illustrated in FIG. 10, is used to etch the oxide or nitride layer 106.

During the operation 309, a pre-defined temperature is maintained within the etching chamber illustrated in FIG. 10. For example, a temperature ranging between 24 and 75 degrees centigrade is maintained in the etching chamber. As another example, a room temperature is maintained in the etching chamber. Moreover, during the operation 309, a pre-defined pressure, such as the atmospheric pressure, is maintained in the etching chamber.

A barrier and seed layer is not deposited on the top surface 104 of the substrate 102. Rather, the oxide or nitride layer 106 is deposited on the top surface 104 of the substrate 102. The seed layer is made from copper. By not depositing the barrier and seed layer, etching of a redistribution layer, such as the redistribution layer 120 (FIGS. 1B and 2B), or the redistribution layer 312 (FIG. 3C), is minimized or prevented. For example, during the etching operations 121 (FIG. 1B), 202 (FIG. 2B), and 309 (FIG. 3B), etching of the redistribution layer is lower compared to that when the barrier and seed layer deposited on the top surface 104 of the substrate 102 is etched. As another example, during the etching operations 121 (FIG. 1B), 202 (FIG. 2B), and 309 (FIG. 3B), an amount of the redistribution layer that is removed is lower compared to an amount of the redistribution layer removed when the barrier and seed layer deposited on the top surface 104 of the substrate 102 is etched. As yet another example, during the etching operations 121 (FIG. 1B), 202 (FIG. 2B), and 309 (FIG. 3B), there is no etching of the redistribution layer. As another example, during the etching operations 121 (FIG. 1B), 202 (FIG. 2B), and 309 (FIG. 3B), no amount of the redistribution layer is removed. Otherwise, if the barrier and seed layer is deposited on the top surface 104, the redistribution layer is etched when the barrier and seed layer is etched. For example, the redistribution layer is etched when the seed layer is etched.

Figure 4:
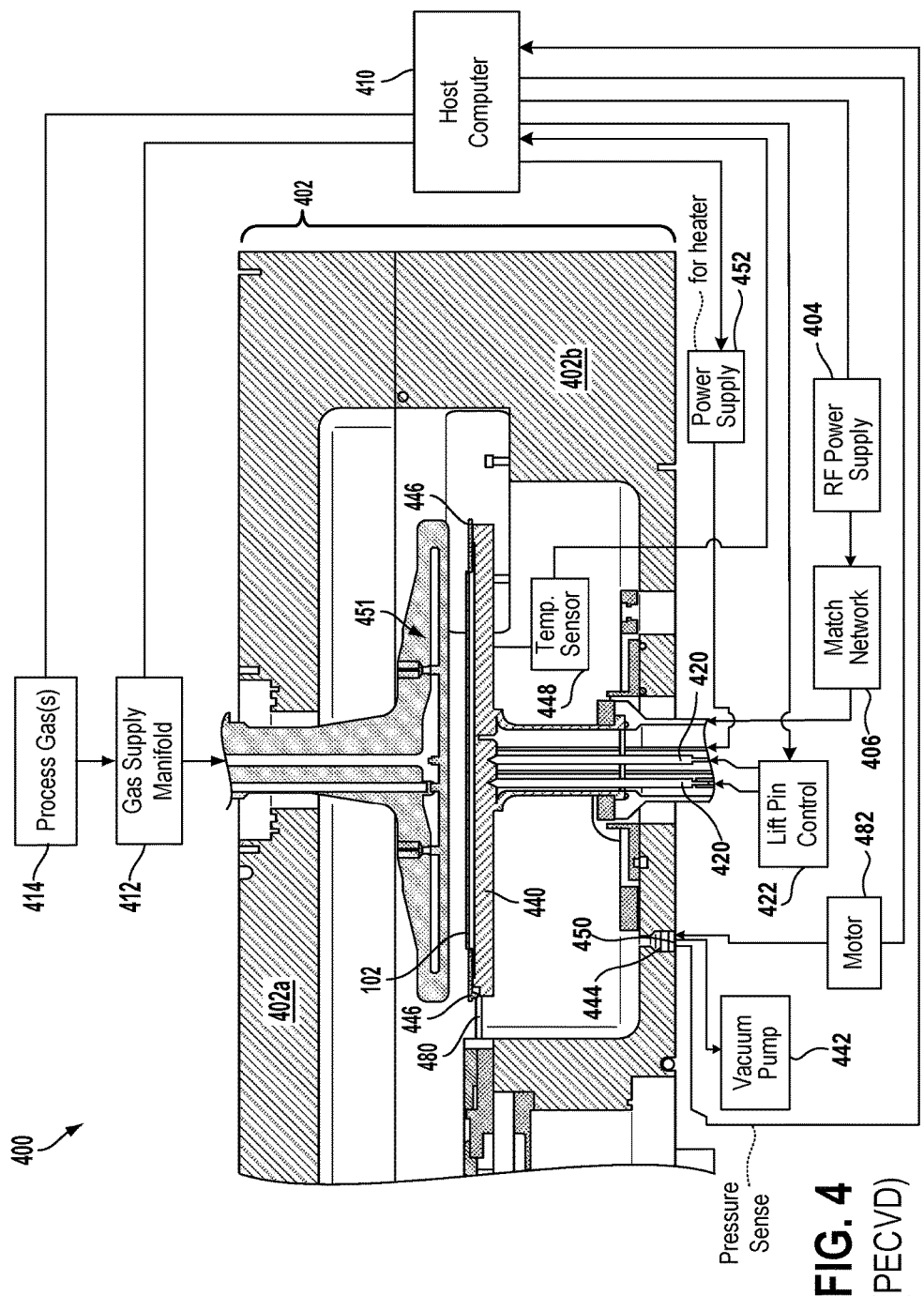
FIG. 4 illustrates an embodiment of a plasma enhanced chemical vapor deposition (PECVD) system used to process a substrate.

FIG. 4 illustrates a PECVD system 400 used to process the substrate 102. The PECVD system 400 includes a plasma chamber 402 having a lower chamber portion 402b and an upper chamber portion 402a. A center column is configured to support a pedestal 440, which in one embodiment is a powered electrode. The pedestal 440 is electrically coupled to a radio frequency (RF) power supply 404 via a match network 406, which is sometimes referred to herein as an impedance matching circuit (IMC). The RF power supply 404 refers to one or more RF generators. An IMC, as used herein, includes multiple electrical components, e.g., one or more capacitors, or one or more resistors, or one or more inductors, or a combination of one or more capacitors and one or more resistors, or a combination of one or more capacitors and one or more inductors, or a combination of one or more resistors and one or more inductors, or a combination of one or more capacitors and one or more resistors and one or more inductors. Some of the one or more electrical components are coupled with each other in a serial manner or a parallel manner.

The RF power supply 404 is controlled by a host computer 410 that includes a controller. Examples of a controller include a processor and a memory device. Examples of the host computer 410 include a desktop computer, or a laptop computer, a tablet, or a smartphone. The host computer 410 includes one or more processors and one or more memory devices coupled to the one or more processors. The processor, for example, is an application specific integrated circuit (ASIC), a programmable logic device (PLD), a central processing unit (CPU), or a microprocessor, etc. Examples of a memory device include a read-only memory (ROM), a random access memory (RAM), a redundant array of storage disks, a hard disk, a Flash memory, etc. The host computer 410 operates the PECVD system 400 by applying process parameters, such as power levels, timing parameters, process gasses, frequency levels, mechanical movement of the substrate 102, etc., so as to deposit or form films over the substrate 102.

The center column is also shown to include lift pins 420, which are controlled by a lift pin control 422. The lift pins 420 are used to raise the substrate 102 from the pedestal 440 to allow an end-effector to pick the substrate 102 and to lower the substrate 102 after being placed by the end end-effector. The PECVD system 400 further includes a gas supply manifold 412 that is connected to a supply 414 of process gases, e.g., gas chemistry supplies from a facility, gases of the oxide or nitride, etc. Depending on the processing being performed, the host computer 410 controls the delivery of the process gases via the gas supply manifold 412, which includes one or more valves for controlling the supply of the process gases. The chosen gases are then flown via the gas supply manifold 412 into a shower head 451 and distributed in a space volume, e.g., a gap, etc., defined between the showerhead 451 face that faces that substrate 102 and the pedestal 440.

Further, the gases may be premixed or not. Appropriate valving and mass flow control mechanisms may be employed to ensure that the correct gases are delivered during the deposition and plasma treatment phases of the process. Process gases exit the plasma chamber 402 via one or more outlets at which corresponding one or more valves, such as a valve 444, are located. A vacuum pump 442 (e.g., a one or two stage mechanical dry pump and/or a turbomolecular pump) draws process gases out of the plasma chamber 402 via the valve 444, which is opens or closes or partially opens or partially closes to maintain a suitably low pressure within the plasma chamber 402. Examples of a valve, as used herein, include a throttle valve or a pendulum valve.

Also shown is a carrier ring 446 that encircles an outer region of the pedestal 440. The carrier ring 446 sits over a carrier ring support region that is a step down from a wafer support region proximate to a center of the pedestal 440. The carrier ring 446 includes an outer edge side, e.g., outer radius, of a disk structure of the substrate 102 and a wafer edge side, e.g., inner radius, of the disk structure that is closest to where the center of the pedestal 440 lies. The wafer edge side of the carrier ring 446 includes a plurality of contact support structures which lift the substrate 102 when the carrier ring 446 is lifted by spider forks 480. The carrier ring 446 is therefore lifted along with the substrate 102 and can be rotated to another station, e.g., in a multi-station system.

The PECVD system 400 further includes a temperature sensor 448 and a pressure sensor 450. An example of a temperature sensor is a thermocouple. An example of a pressure sensor includes a pressure transducer having a diaphragm to measure force per unit area of a material that passes via the diaphragm and to generate an electrical signal according to the force per unit area. Another example of a pressure sensor includes a capacitive gauge. The temperature sensor 448 is coupled to a portion, such as the lower electrode, of the pedestal 440 or to one or more heater elements located within the pedestal 440. Examples of one or more heater elements, as used herein, include one or more resistors, which are provided a current that heats the one or more resistors. Moreover, the pressure sensor 450 is located adjacent to the valve 444 to measure a flow of materials flowing out from the plasma chamber 402 to the vacuum pump 442.

The PECVD system 400 includes a power supply 452 that is coupled to the one or more heater elements of the pedestal 440. An example of the power supply 452 is a direct current (DC) power supply. The PECVD system 400 includes a motor 482 that is coupled to the valve 444 via a connection mechanism. Examples of a connection mechanism, as used herein include one or more rods or a combination of gears and rods.

The host computer 410 sends the process parameters to the RF power supply 404. The RF power supply 404 generates one or more RF signals having the frequency levels and the power levels of the process parameters and supplies the one or more RF signals to one or more inputs of the match network 406 via corresponding one or more RF cables. The one or more RF cables connect the RF power supply 404 to the match network 406. Each RF generator of the RF power supply 404 is coupled via a different RF cable to a different input of the match network 406. The match network 406 matches an impedance of a load coupled to an output of the match network 406 with that of a source coupled to the one or more inputs of the match network 406. Examples of the load include the plasma chamber 402 and an RF transmission line that connects the match network 406 to the plasma chamber 402. Examples of the source includes the RF power supply 404 and the one or more are RF cables. The match network 406 generates a modified RF signal upon receiving the one or more RF signals from the RF power supply 404 and sends the modified RF signal to the lower electrode of the pedestal 440.

The process gases are supplied via the gas supply manifold 412 and the showerhead 451 to the gap between the showerhead 451 and the pedestal 440 to generate or strike plasma within the plasma chamber 402. The plasma is then used to process, such as etch, deposit materials on, etc., the substrate 102. For example, the oxide or nitride layer 106 is deposited on the substrate 102. During processing of the substrate 102, the valve 444 is opened or closed or partially closed to allow materials, such as plasma materials, from within the plasma chamber 402 to flow out of the plasma chamber 402 by the use of the vacuum pump 442.

Moreover, during processing of the substrate 102, the temperature sensor 448 measures a temperature of the portion of the pedestal 440 and the temperature is indicative of temperature within the plasma chamber 402. In addition, during processing of the substrate 102, the pressure sensor 450 measures a pressure created by flow of the plasma materials out of the plasma chamber 402 via the valve 444. The temperature and pressure are provided from the temperature sensor 448 and the pressure sensor 452 to the processor of the host computer 410.

The processor of the host computer 410 determines whether the measured temperature is a predefined temperature and whether the measured pressure is a predefined pressure. Upon determining that the measured temperature is not a predefined temperature, the processor of the host computer 410 controls the power supply 452 to change a magnitude of a power signal. The power signal with the changed magnitude is generated by the power supply 452 and sent to the one or more heater elements of the pedestal 446 to heat or cool the one or more heating elements to further change the temperature within the gap between the pedestal 440 and the showerhead 451. On the other hand, upon determining that the measured temperature is a predefined temperature, the processor of the computer 410 does not control the power supply 452 to change the temperature within the plasma chamber 402.

Similarly, upon determining that the measured pressure is not a predefined pressure, the processor of the host computer 410 controls the valve 444 to close or open or partially close to change an amount of pressure within the plasma chamber 402. For example, the host computer 410 sends a control signal to a motor driver, e.g., one or more transistors, to generate a current signal. The current signal is sent from the motor driver to a rotor of the motor 482 to rotate the rotor with respect to a stator of the motor to rotate the valve 444 via the connection mechanism. The rotation of the valve 444 changes a position of the valve 444 from open to close or close to open or open to partially close or close to partially open. On the other hand, upon determining that the measured pressure is a predefined pressure, the processor of the computer 410 does not control the valve 444 to change the pressure within the plasma chamber 402.

In an embodiment, an upper electrode within the showerhead 451 is grounded when RF power is supplied from the RF power supply 404 to the lower electrode within the pedestal 440 via the match network 406.

In one embodiment, instead of the pedestal 440 being electrically coupled to the RF power supply 404 via the match network 406, the upper electrode within the showerhead 451 is coupled to an RF power supply via a match network for receiving power from the RF power supply and the lower electrode within the pedestal 440 is grounded.

In an embodiment, both the upper electrode and the lower electrodes are coupled to RF power supplies via corresponding match networks.

FIG. 5 is a diagram of an embodiment of the system 500 that includes a spinner 502. The system 500 includes the host computer 410, a motor 506, the motor 482, the vacuum pump 442, and a liquid storage 510. A substrate package 503, such as the substrate 102, the substrate package 180 (FIG. 1A), the substrate package 280 (FIG. 2A), or the substrate package 380 (FIG. 3A), is placed on top of a support 516, e.g., a metal support, a plastic support, etc., within the spinner 502. The support 516 is connected to the motor 506 via a connection mechanism, examples of which are provided above.

The motor 506 is coupled to the host computer 410, which is coupled to the vacuum pump 442 and a valve 512. The host computer 410 controls the valve 512 via the motor 482 to open or close or partially open or partially close the valve 512. For example, the host computer 410 sends a signal to the motor driver to generate a current. The current is supplied to the motor 482 that operates to open or close or partially open or partially close the valve 512. The opening or partial opening of the valve 512 allows passage of a liquid, e.g., the oxide or nitride deposited in the operation 103 (FIGS. 1A, 2A, and 3A), the photoresist deposited in the operation 109 (FIGS. 1A, 2A, and 3A), to the spinner 502 to be deposited on the top surface of the substrate package 503. For example, the oxide or nitride is deposited at or close to a center of the top surface of the substrate 102. As another example, the photoresist is deposited at or close to a center of the top surface of the substrate package 180, 280, or 380.

After depositing the liquid on the top surface of the substrate package 503, the host computer 410 controls the motor 506 to operate to rotate the support 516. For example, the host computer 410 sends a control signal to a motor driver, e.g., one or more transistors, to generate a current signal. The current signal is sent to a rotor of the motor 506 to rotate the rotor with respect to a stator of the motor 506 to rotate the support 516 via the connection mechanism. The rotation of the support 516 rotates the top surface of the substrate package 503 to evenly spread the liquid on the top surface via a centrifugal force such that the liquid is deposited on the top surface.

The host computer 410 controls the vacuum pump 442 to operate to remove any excess liquid within the spinner 502. For example, the host computer 410 sends a signal to a vacuum driver, e.g., one or more transistors, etc., to turn on the vacuum pump 442 to create a partial vacuum within the spinner 502 to remove any excess liquid from the spinner 502. In some embodiments, the vacuum pump 442 is operated by the host computer 410 before the liquid is allowed to enter into the spinner 502 from the liquid storage 510 to remove any excess remnant liquid from the spinner 502.

FIG. 6 is a diagram of an embodiment of the CVD reactor system 600 to illustrate chemical vapor deposition. The CVD reactor system 600 includes a CVD reactor 602. The CVD reactor 602 has a housing, which further includes a top housing 604 and a bottom housing 606. Between the top housing 604 and the bottom housing 606 lies an inlet duct 608 for entry of reactive gases. Within the inlet duct 608, a valve 622 is situated. Moreover, between the top housing 604 and the bottom housing 606 is a gap in which multiple vanes 610A and 610B are located. The vanes 610B are located opposite to the vanes 610A. Between the vanes 610A and 610B and underneath the gap, a wafer support plate 612 is located. The wafer support plate 612 supports a wafer 614 on top of the wafer support plate 612. An example of the wafer 614 includes a combination of the substrate 102 and the oxide or nitride layer 106 (FIGS. 1A and 3A). The wafer support plate 612 is located above an insulator 613, such as a ceramic plate. Under the insulator 613 and above the bottom housing 606, there is an area 618 within the housing of the CVD reactor 602 in which one or more heating coils 616 are located. Below the area 618, an outlet duct 620 is situated for exit of the reactive gases from the CVD reactor 602. Within the outlet duct, the pressure sensor 450 is located. Moreover, the temperature sensor 448 is coupled to the area 618, such as to the one or more heating coils 616, to measure temperature within the area 618. The temperature within the area 618 is representative of temperature in the gap between the top housing 604 and the wafer 614.

The host computer 410 is coupled to the valve 622 via the motor driver and the motor 482. The motor driver that is coupled to the host computer 410 is located within the host computer 410 or outside the host computer 410. The motor 482 is coupled via a connection mechanism, examples of which are provided above, to the valve 622 to control a pressure of flow of the reactive gases into the CVD reactor 602. In addition, examples of the driver are provided above. Moreover, the host computer 410 is coupled to the one or more heating coils 616 via the DC power supply 452 to control a temperature of the one or more heating coils 616.

The reactive gases, such as a vapor form of a deposition material, such as the tungsten-based material or Ruthenium, transfers via the duct 608 through gaps between the vanes 610A into the gap between the top housing 604 and the wafer 614. The vanes 610a facilitated traverse flow, in a horizontal direction of the deposition material over a top surface of the wafer 614. The deposition material traverses over the top surface of the wafer 614 in the horizontal direction to be deposited on the top surface. Moreover, remnants of the reactive gases exit through gaps between the vanes 610B and via the outlet duct 620.

Upon receiving a measured pressure from the pressure sensor 450 and determining that the measured pressure is not the same as a predefined pressure, the processor of the host computer 410 sends a signal to the motor driver. Upon receiving the signal, the motor driver generates a current signal and sends a current signal to the motor 482. The motor 482 operates in a manner described above to control, such as open, close, partially open, or partially close the valve 622 to control a flow of the reactive gases into the gap between the top housing 604 and the wafer support plate 612 to control pressure within the CVD reactor 602. The pressure is controlled until the measured pressure received from the pressure sensor 450 is equal to the predefined pressure. On the other hand, upon determining that the measured pressure is equal to the predefined pressure, the processor of the host computer 410 does not control the valve 622.

Similarly, upon receiving a measured temperature from the temperature sensor 448 and determining that the measured temperature is not the same as a predefined temperature, the processor of the host computer 410 sends a signal to the power supply 452 to change in amount of a power signal. Upon receiving the signal from the processor, the power supply 452 changes a magnitude of the power signal that is generated by the power supply 452 and sends the power signal with the changed magnitude to the one or more heating coils 616. An amount of heat generated by the one or more heating coils 616 changes upon receiving the power signal with the changed magnitude to change a temperature within the gap between the top housing 604 and the wafer support plate 612. The one or more heating coils 616 are controlled by the processor of the host computer 410 until the measured temperature is the same as the predefined temperature. On the other hand, upon determining that the measured temperature is the same as the predefined temperature, the processor of the host computer 410 does not control the amount of heat that is generated by the one or more heating coils 616 via the power supply 452.

The processor of the host computer 410 controls a flow rate of the reactive gases that flow into the CVD reactor 602 to achieve a pre-defined thickness of a layer, such as the tungsten based layer 108 (FIG. 1A) or the Ruthenium layer 302 (FIG. 3A). For example, the processor of the host computer 410 controls an amount of the reactive gases that flow into the gap between the top housing 604 and the wafer support plate 612 of the CVD reactor 602 by controlling an amount of time for which the valve 622 is open. The memory device of the host computer 410 stores a correspondence, such as a one-to-one relationship or a mapping, between a pre-defined thickness of the layer and the amount of time for which the valve 622 is open. The processor of the host computer 410 accesses the correspondence to access the pre-defined thickness to further access the amount of time, and sends a signal to the motor driver to control the valve 622 to open the valve 622 for the amount of time. Upon determining that the amount of time is complete, the processor of the host computer 410 controls the valve 622 to close the valve 622.

FIG. 7A is a diagram of an embodiment of an electroless deposition system 700 to illustrate deposition of the metal-based material on the tungsten-based layer 108 of FIG. 1A or on the oxide or nitride layer 106 of FIG. 2A. The electroless deposition system 700 includes a container 702, such as a diptank, having a slot for entry of a wafer 704. An example of the wafer 704 includes a combination of the substrate 102, the oxide or nitride layer 106 and the tungsten-based layer 108, as illustrated in FIG. 1A. Another example of the wafer 704 includes a combination of the substrate 102 and the oxide or nitride layer 106, as illustrated in FIG. 2A. A top portion 706 of the container 702 has one or more heater elements 724 for controlling a temperature within the container 702. Examples of the one or more heater elements 724 are provided above. The host computer 410 is coupled to the one or more heating elements via the power supply 452. Moreover a bottom surface of a bottom portion 708 of the container 702 has an exhaust port 712 for exit of inert gases that are supplied via the top portion 706 to a space within the container 702. Examples of the inert gases include nitrogen and argon. The inert gases are supplied so that a chemical solution, such as a mixture of the metal-based material and a reducing agent, within the container 702 does not interact with undesirable gases, such as oxygen. Within the container 702 lies a substrate support 710 for supporting the wafer 704. Examples of the reducing agent include phosphine, diborane, or silane, or a combination thereof. The substrate support 710 is similar in structure to the wafer support plate 612, described above.

The reducing agent reduces the metal-based material, which is usually present in solution as metal-based ions, allowing the metal-based material to deposit on the tungsten-based layer 108. Reduction is a process of removal of electrons from the metal-based material for interaction with the tungsten-based material. The electrons that are removed bond with the tungsten-based material to deposit the metal-based layer 110 on the tungsten-based layer 108.

It should be noted that in the embodiment illustrated in FIG. 2A in which the metal-based material is deposited on the oxide or nitride layer 106, the reducing agent is not used. The chemical solution includes the metal-based material without including the reducing agent.

The electroless deposition system 700 further includes the host computer 410, the temperature sensor 448, and the pressure sensor 450. The pressure sensor 450 is located in an outlet 720 located within the bottom surface of the bottom portion 708 of the container 702. The outlet 720 allows disposing of remnants of the chemical solution from the container 702. The temperature sensor 448 is coupled to the substrate support 710 for measuring a temperature of the substrate support 710. The temperature of the substrate support 710 is representative of temperature within the container 702. A valve 722, examples of which are described above, is located at a bottom area of the outlet 720 to open, close, partially open, or partially close the outlet 720. The host computer 410 is coupled to the valve 722 via the motor driver, the motor 482 and a connection mechanism, examples of which are described above. The motor driver is located within the host computer 410 or outside the host computer 410.

Upon determining that the measured temperature within the container 702 is not the same as a predefined temperature, the processor of the host computer 410 controls the power supply 452 to change a magnitude of a power signal. The power signal with the changed magnitude is generated by the power supply 452 and sent to the one or more heater elements 724 within the top portion 706 to change a temperature of the space within the container 702. On the other hand, upon determining that the measured temperature is a predefined temperature, the processor of the computer 410 does not control the power supply 452 to change temperature of the space within the container 702.

Similarly, upon determining that the measured pressure is not a predefined pressure, the processor of the host computer 410 controls the valve 722 to close or open or partially close to change an amount of pressure within the container 702. For example, the host computer 410 sends a control signal to the motor driver to generate a current signal. The current signal is sent to the rotor of the motor 482 to rotate the rotor with respect to the stator of the motor 482 to rotate the valve 722 via the connection mechanism. The rotation of the valve 722 changes a position of the valve 722 from open to close or close to open or open to partially close or close to partially open to change pressure within the container 702. On the other hand, upon determining that the measured pressure is a predefined pressure, the processor of the computer 410 does not control the valve 722 to change pressure within the container 702.

FIG. 7B is a diagram of an embodiment of an electroless deposition system 750 to illustrate deposition of the metal-based material on the wafer 704. The electroless deposition system 750 includes a container 752, the temperature sensor 448, the host computer 410, the motor 482, a nozzle 754, a duct portion 756A, another duct portion 756B, and a valve 758. Examples of the valve 758 are provided above. The valve 758 is located between the duct portions 756A and 756B to control a flow of the chemical solution, examples of which are provided with reference to FIG. 7A above, to a space within the container 752. The container 752 includes a wafer support 760 placed at the bottom of the container for supporting the wafer 704. Examples of a wafer support are provided above. Moreover, a bottom portion of the container 752 includes an outlet 762 for allowing exit of remnants of the chemical solution from the space within the container 752 to outside the container 752.

The wafer support 768 is coupled to the temperature sensor 448 for measuring temperature of the wafer support 760. The temperature of the wafer support 760 represents temperature within the container 752. Moreover, the outlet 762 includes the pressure sensor 450. The wafer support 762 includes one or more heater elements 766, examples of which are provided above.

The host computer 410 is coupled via the motor driver to the motor 482. The motor 482 is coupled via a connection mechanism, examples of which are provided above, to the valve 758.

The chemical solution is supplied via the duct portions 756A and 756B and the nozzle 754 to the space within the container 752 to be deposited on the top surface of the wafer 704. Upon determining that the measured temperature within the container 752 is not the same as a predefined temperature, the processor of the host computer 410 controls the power supply 452 to change a magnitude of a power signal. The power signal with the changed magnitude is generated by the power supply 452 and sent to the one or more heater elements 766 within the wafer support 760 to change a temperature of the space within the container 752. On the other hand, upon determining that the measured temperature is a predefined temperature, the processor of the computer 410 does not control the power supply 452 to change temperature of the space within the container 752.

Similarly, upon determining that the measured pressure is not a predefined pressure, the processor of the host computer 410 controls the valve 758 to close or open or partially close to change an amount of pressure within the container 752. For example, the host computer 410 sends a control signal to the motor driver to generate a current signal. The current signal is sent to the rotor of the motor 482 to rotate the rotor with respect to the stator of the motor 482 to rotate the valve 758 via the connection mechanism. The rotation of the valve 758 changes a position of the valve 758 from open to close or close to open or open to partially close or close to partially open to change pressure within the container 752. On the other hand, upon determining that the measured pressure is a predefined pressure, the processor of the computer 410 does not control the valve 758 to change pressure within the container 752.

The processor of the host computer 410 controls a flow rate of the chemical solution that is supplied to the container 752 to achieve a pre-defined thickness of a layer, such as the metal-based layer 110 (FIGS. 1A and 2A). For example, the processor of the host computer 410 controls an amount of the chemical solution that enters into the container 752 on top of the wafer 704 by controlling an amount of time for which the valve 758 is open. The memory device of the host computer 410 stores a correspondence, such as a one-to-one relationship or a mapping, between a pre-defined thickness of the layer and the amount of time for which the valve 758 is open. The processor of the host computer 410 accesses the correspondence to access the pre-defined thickness to further access the amount of time, and sends a signal to the motor driver to control the valve 758 to open the valve 758 for the amount of time. Upon determining that the amount of time is complete, the processor of the host computer 410 controls the valve 758 to close the valve 758.

Figure 8:
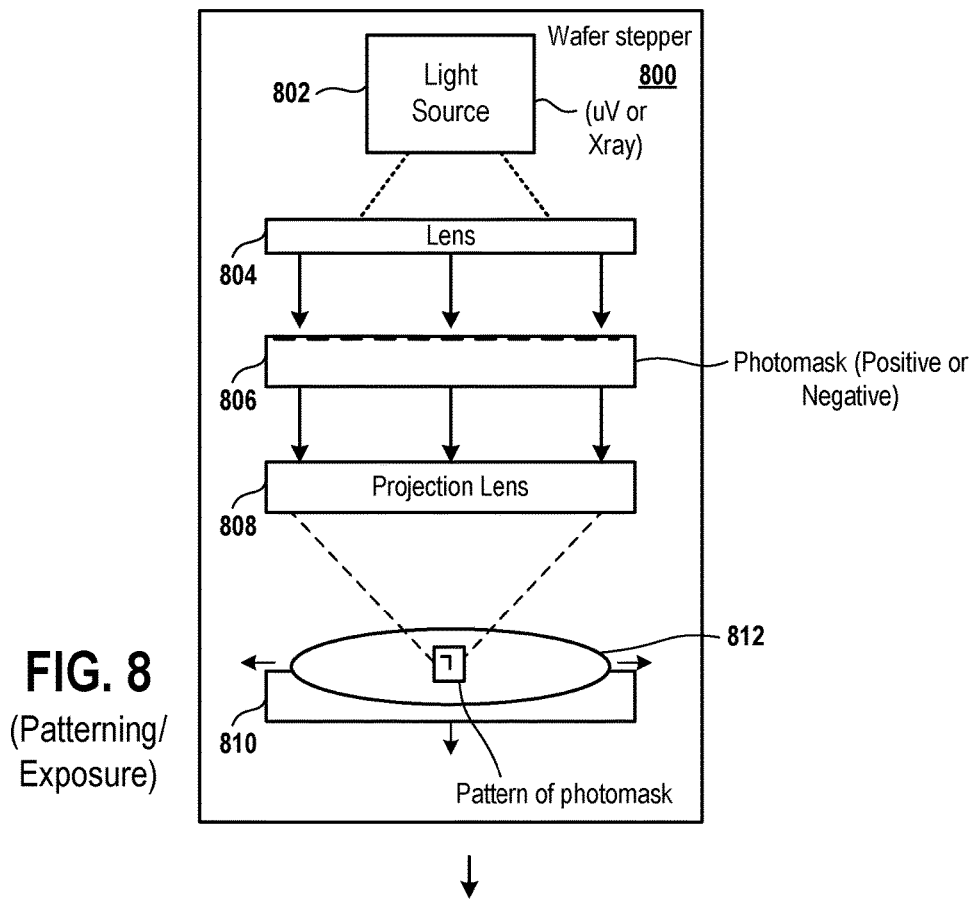
FIG. 8 is a diagram of an embodiment of a wafer stepper for illustrating formation of a pattern within a photoresist layer.

FIG. 8 is a diagram of an embodiment of the wafer stepper 800 for illustrating formation of a pattern within the photoresist layer 112. The wafer stepper 800 includes a light source 802, e.g., an ultraviolet (UV) light source, an X-ray light source, etc., a lens 804, a photomask 806, and a projection lens 808. An example of the UV light source includes a mercury-vapor lamp. A wafer 812 is placed on a substrate holder 810 within the wafer stepper 800. Examples of the wafer 812 include the substrate package 172 (FIG. 1A), the substrate package 272 (FIG. 2A), and the substrate package 372 (FIG. 3A).

The light source 802 generates light, e.g., UV light, x-ray, etc., that passes through the lens 804. The lens 804 directs, e.g., focuses, the light towards the photomask 806. The directed light passes through areas of the photomask 806 that allow passage of the directed light and is incident on the projection lens 808. The projection lens 808 directs the incident light on a portion of the photoresist layer 112 on which the pattern is to be imposed, e.g., imprinted, overlaid, etc. The pattern is defined by a combination of the segments, such as the segments 116A and 116B, and the vias, such as the via 114A. The light that is directed on the photoresist layer 112 overlays the pattern on the photoresist layer 112. The substrate holder 810 is moved in x and y directions to repeat the imposition of the pattern.

Figure 9:
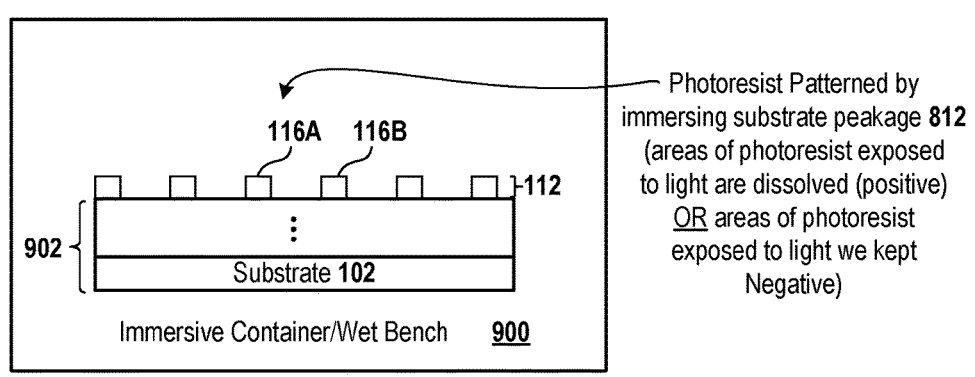
FIG. 9 is a diagram of an embodiment of an immersive container to illustrate stripping of segments of the photoresist layer on which the pattern is imposed.

FIG. 9 is a diagram of an embodiment of the immersive container 900 to illustrate stripping of segments of the photoresist layer 112 on which the pattern is imposed. The immersive container 900 is filled with a chemistry solution, e.g., a developer, deionized water combined with nitrogen, deionized water, etc., to remove areas of the photoresist layer 112 that are exposed to light. If the photoresist material of the photoresist layer 112 is positive, regions of the photoresist material that are exposed to the light become soluble in the chemistry solution when immersed. On the other hand, if the photoresist material of the photoresist layer 112 is negative, regions of the photoresist material that are not exposed to the light become soluble in the chemistry solution when immersed. An example of photolithography is described in US Patent Application Publication No. 2008/0171292, which is incorporated by reference herein in its entirety. The photoresist layer 112 is stripped to generate a substrate package 902. Examples of the substrate package 902 include the substrate package 174 (FIG. 1B), the substrate package 274 (FIG. 2B), and the substrate package 374 (FIG. 3A).

FIG. 10 is a diagram of an embodiment of the system 1000 for illustrating the descum operation 113 (FIGS. 1B, 2B, and 3A), the photoresist stripping operation 119 (FIGS. 1B, 2B, and 3B), the etching operation 121 (FIG. 1A), the etching operation 202 (FIG. 2B), and the etching operation 309 (FIG. 3B). The system 1000 includes a radio frequency generator (RFG) 1102, an IMC 1004, a plasma chamber 1011, a container 1005 for storage of one or more etchants, the host computer 410, another RFG 1012, another IMC 1014, the motor 482, the temperature sensor 448, the pressure sensor 450, the power supply 452, and the vacuum pump 442. Examples of the one or more etchants include an acid, such as hydrochloric acid, sulfuric acid, nitric acid, or a combination thereof. Other examples of the one or more etchants are provided above.

The host computer 410 is coupled to the RFG 1002 via a cable, e.g., a serial data transfer cable, a parallel data transfer cable, a universal serial bus (USB) cable, etc. Similarly, the host computer 410 is coupled to the RFG 1012 via another cable, e.g., a serial data transfer cable, a parallel data transfer cable, a USB cable, etc.

The RFG 1002 is coupled to the IMC 1004 via an RF cable 1026 and the IMC 1004 is coupled to a showerhead 1010 within the plasma chamber 1011 via an RF transmission line 1028. Moreover, the RFG 1012 is coupled to the IMC 1014 via an RF cable 1030 and the IMC 1014 is coupled to a chuck 1020 via an RF transmission line 1032.

The plasma chamber 1011 includes the chuck 1020, e.g., an electrostatic chuck (ESC), on which a substrate package 1008 is placed. The plasma chamber 1011 further includes the showerhead 1010, and other parts (not shown), e.g., a lower dielectric ring surrounding a lower electrode of the chuck 1020, a lower electrode extension surrounding the lower dielectric ring, a lower PEZ ring, etc. Examples of the substrate package 1008 include the substrate package 174 (FIG. 1B), the substrate package 176 (FIG. 1B), the substrate package 178 (FIG. 1B), the substrate package A described above with reference to FIG. 1B, and the substrate package B described above with reference to FIG. 1B. Further examples of the substrate package 1008 include substrate package 274 (FIG. 2B), the substrate package 276 (FIG. 2B), the substrate package 278 (FIG. 2B), and the substrate package C described above with reference to FIG. 2B. Additional examples of the substrate package 1008 include substrate package 374 (FIG. 3A), the substrate package 376 (FIG. 3B), the substrate package 378 (FIG. 3B), and the substrate package D described above with reference to FIG. 3B. The showerhead 1010 is located opposite to, on top of, and facing the chuck 1020. The chuck 1020 is made of a metal, e.g., aluminum, alloy of aluminum, copper, a combination of copper and aluminum, etc.

The showerhead 1010 faces the chuck 1020. The showerhead 1010 includes multiple holes to allow the one or more etchants stored in the container 1005 to be applied to the substrate package 1008 placed on the chuck 1020. The showerhead 1010 also includes an upper electrode plate. In some embodiments, the upper electrode plate of the showerhead 1010 is made from aluminum, or an alloy of aluminum, or copper, or a combination of copper and aluminum, etc.

The host computer 482 is coupled via the motor driver, the motor 482, and a connection mechanism to a valve 1006, examples of which are provided above. Moreover, examples of the connection mechanism are provided above. The valve 1006 is located to control a supply of the one or more etchants via a duct 1050 that is coupled to the container 1005 and the showerhead 1010.

The host computer 410 is coupled via the power supply 452 to one or more heater elements 1052 located within the chuck 1020. Examples of the one or more heater elements 1052 are provided above. The temperature sensor 448 is coupled to the chuck 1020, such as to the one or more heater elements 1052, to measure a temperature of the chuck 1020.

The temperature of the chuck 1020 is representative of temperature of a gap between the showerhead 1010 and the chuck 1020 within the plasma chamber 1011. Moreover, the pressure sensor 450 is located at an opening 1034, which is formed within a bottom surface of the plasma chamber 1011. The opening 1034 allows remnants of the one or more etchants or remnants of plasma to flow from a space within the plasma chamber 1011 to outside the plasma chamber 1011. The vacuum pump 1042 operates to remove any remnant materials, such as remnant plasma or remnant etchants, from the space within the plasma chamber 1011 to outside the plasma chamber 1011.

When the valve 1006 is open, the one or more etchants flow from the container 1005 via the duct 1050 and the showerhead 1010 into the gap between the showerhead and the chuck 1020. Moreover, upon receiving a control signal from the processor of the host computer 410 via the cable, the RFG 1002 generates an RF signal that is supplied to the IMC 1004. Upon receiving the RF signal from the RFG 1002, the IMC 1004 matches an impedance of a load coupled to an output of the IMC 1004 with that of a source coupled to an input of the IMC 1004 to generate a modified RF signal. Examples of the load coupled to the IMC 1004 include the plasma chamber 1011 and the RF transmission line 1028. Examples of the source coupled to the IMC 1004 include the RFG 1002 and the RF cable 1026. The modified RF signal is sent from the IMC 1004 via the RF transmission line 1028 to the upper electrode of the showerhead 1010.

Similarly, upon receiving a control signal from the host computer 410 via the cable, the RFG 1012 generates an RF signal that is supplied to the IMC 1014. Upon receiving the RF signal from the RFG 1012, the IMC 1014 matches an impedance of a load coupled to an output of the IMC 1014 with that of a source coupled to an input of the IMC 1014 to generate a modified RF signal. Examples of the load coupled to the IMC 1014 include the plasma chamber 1011 and the RF transmission line 1032. Examples of the source coupled to the IMC 1014 include the RFG 1012 and the RF cable 1030. The modified RF signal is sent from the IMC 1014 via the RF transmission line 1032 to the chuck 1020.

The supply of the modified RF signal to the showerhead 1010, the modified RF signal to the chuck 1020, and the one or more etchants to the plasma chamber 1011 generates or maintains plasma within the plasma chamber 1011. The plasma includes ions of the one or more etchants and the ions react with portions a top layer of the substrate package 1008 to remove the portions or to perform the descum operation 113 on the layer. To illustrate, when the one or more etchants include carbon dioxide or another etchant gas, the photoresist stripping operation 119 is performed. As another illustration, when the one or more etchants include oxygen or an etchant gas, the descum operation 113 is performed. As yet another illustration, when the one or more etchants described above with reference to FIGS. 1B, 2B and 3B are used, the etching operations 121 (FIG. 1B), 202 (FIG. 2B), and 309 (FIG. 3B) are performed.

Upon determining that the measured temperature within the plasma chamber 1011 is not the same as a predefined temperature, the processor of the host computer 410 controls the power supply 452 to change a magnitude of a power signal. The power signal with the changed magnitude is generated by the power supply 452 and sent to the one or more heater elements 1052 within the chuck 1020 to change a temperature of the gap within the plasma chamber 1011. On the other hand, upon determining that the measured temperature is a predefined temperature, the processor of the host computer 410 does not control the power supply 452 to change temperature of the gap within the plasma chamber 1011.

Similarly, upon determining that the measured pressure is not a predefined pressure, the processor of the host computer 410 controls the valve 1006 to close or open or partially close to change an amount of pressure within the plasma chamber 1011. For example, the host computer 410 sends a control signal to the motor driver to generate a current signal. The current signal is sent to the rotor of the motor 482 to rotate the rotor with respect to the stator of the motor 482 to rotate the valve 1006 via the connection mechanism. The rotation of the valve 1006 changes a position of the valve 1006 from open to close or close to open or open to partially close or close to partially open to change pressure within the plasma chamber 1011. On the other hand, upon determining that the measured pressure is a predefined pressure, the processor of the host computer 410 does not control the valve 1006 to change pressure within the plasma chamber 1011.

In some embodiments, different plasma chambers, such as the plasma chamber 1011, are used to perform the descum operation 113, the photoresist stripping operation 119, and an etching operation, such as the operation 121, 202, or 309. For example, a first plasma chamber is used to perform the descum operation 113, a second plasma chamber is used to perform the photoresist stripping operation 119, and third plasma chamber is used to perform the etching operation 121. Each of the first, second, and third plasma chamber has the same structure as the plasma chamber 1011.

FIG. 11A is a diagram of an embodiment of a system 1100 for illustrating the pre-treatment operation 115 (FIGS. 1B, 2B, and 3A). The system 1100 includes a chamber 1102, a motor 1104, and a container 1106. The motor 1104 is coupled to a wafer holder 1108 via a connection mechanism, examples of which are provided above. The wafer holder 1108 holds a substrate package 1112. Examples of the substrate package 1112 include the substrate package 174 (FIG. 1B), the substrate package 274 (FIG. 2B), and the substrate package 374 (FIG. 3A).

The host computer 410 sends a signal to the motor driver. The motor driver upon receiving the signal generates a current signal, which is supplied to the motor 482. The motor 482 operates to open the valve 1110. When the valve 1110 is open, a pre-wetting fluid, e.g., water, a water-miscible solvent, deionized water, a combination of deionized water and the water-miscible solvent, etc., from the container 1106 flows into the chamber 1102. Moreover, the host computer 410 sends a signal to a motor driver, examples of which are provided above, to operate the motor 1104. For example, the motor driver generates a current signal to operate the motor 1104. The motor 1104 operates, e.g., rotates, etc., to lower a position of the wafer holder 1108 to enable the substrate package 1112 to be immersed into the pre-wetting fluid in the chamber 1102.

Once the substrate package 1112 is pre-wetted, the motor 1104 is operated to raise the wafer holder 1108 to remove the substrate package 1112 from being immersed in the pre-wetting fluid. The motor 1104 is further operated to rotate the wafer holder 1108 to remove the pre-wetting fluid from a top surface of the substrate package 1112. Before, during, or after the pre-treatment operation 115, the vacuum pump 442 is operated by the processor of the host computer 410 to remove remnant materials, e.g., remnants of the pre-wetting fluid, from the chamber 1102.

FIG. 11B is a diagram of an embodiment of a system 1120 for illustrating the pre-treatment operation 115 (FIGS. 1B, 2B, and 3A). The system 1120 includes a chamber 1122, the motor 1104, and the container 1106. The motor 1104 is coupled to a chuck 1124 via a connection mechanism, examples of which are described above. The chuck 1124 supports the substrate package 1112. For example, the chuck 1124 has arms orientated at equal angles, e.g., 120 degrees, around a circumference of the substrate package 1112 to hold the substrate package 1112.

When the valve 1110 is open, the pre-wetting fluid from the container 1106 is dispensed or sprayed into the chamber 1122 on top of the substrate package 1112. The processor of the host computer 410 sends a signal to the motor driver to operate the motor 482. The motor operates to open the valve 1110. The host computer 410 sends a signal to the motor driver to operate the motor 1104. The motor 1104 operates, e.g., rotates, etc., to rotate the substrate package 1112 while the substrate package 1112 is being held by the chuck 1124 and while the pre-wet fluid is being applied to the substrate package 1112. The substrate package 1112 is being held to reduce chances of slipping or moving of the substrate 1112. In some embodiments, the motor 1104 is not being operated while the pre-wetting fluid is being applied to the substrate package 1112.

Once the substrate package 1112 is pre-wetted, the motor 1104 is operated to rotate the chuck 1124 to remove the pre-wetting fluid from the surface of the substrate package 1112 to be collected at a bottom of the chamber 1122. Before, during, or after the pre-treatment operation 115, the vacuum pump 442 is operated to remove the undesirable remnant materials from the chamber 1122.

FIG. 12 is a diagram of an embodiment of an electrode-position system 1200 for illustrating the electrodeposition operation 117 (FIGS. 1B and 2B), the copper seed layer deposition operation 305 (FIG. 3A), and the bulk copper deposition operation 307 (FIG. 3B). The system 1200 includes the host computer 410, a rotatable spindle 1218, a chamber 1220, a container 1222 for storing a catholyte, and a pump 1224. Examples of the catholyte include a liquid made of copper. In some embodiments, the catholyte includes the liquid made of copper and further includes a combination of one or more levelers. The leveler levels copper to form a level, e.g., the level L1 (FIGS. 1B and 2B), the level L3 (FIG. 3A), or the level L4 (FIG. 3B), etc., of copper on top of another layer, e.g., the portions of the metal-based layer 110 (FIG. 1B, 2B), the portions of the Ruthenium layer 302 (FIG. 3A), or the copper seed layer 304 (FIG. 3A), etc.

A substrate package 1204 is held, positioned, and rotated by a wafer holder 1206 of the chamber 1220. Examples of the substrate package 1204 include the substrate package 174 (FIG. 1B), the substrate package 274 (FIG. 2B), the substrate package 374 (FIG. 3A), and the substrate package 381 (FIG. 3A). The chamber 1220 includes a plating cell 1208, which is dual chamber cell having an anode chamber with, for example, a counter electrode 1209, e.g., a copper electrode, etc., and anolyte. The dual chamber has a cathode chamber having the catholyte. The anode chamber and cathode chamber are separated by, for example, a membrane 1210, e.g., a cationic membrane, which is used for electrodeposition and is supported by a support member 1212.

The system 1200 further includes a channeled ionically resistive plate (CIRP) 1214. A flow diverter 1216 is on top of the CIRP 1214, and aides in creating a transverse shear flow of the catholyte. The catholyte is introduced from the container 1222 via flow ports 1233 above the cationic membrane 1210. From the flow port 1233, the catholyte passes through the CIRP 1214 and produces impinging flow onto a surface, e.g., on top of the portion 110A (FIGS. 1B and 2B) of the metal-based layer 110, on top of the portion 302A of the Ruthenium layer 302 (FIG. 3A), on top of the copper seed layer 304 (FIG. 3A), etc., of the substrate package 1204 to deposit copper on the surface. Moreover, the catholyte is introduced from the container 1222 via the pump 1224 into a flow port 1230, which is located at a side 1202 of the chamber 1220. For example, an inlet of the flow port 1230 is located below the counter electrode 1209. In this example, the flow port 1230 is a channel in a side wall 1232 of the chamber 1220. The functional result is that catholyte flow is introduced directly into a plating region formed between the CIRP 1214 and the substrate package 1204 to enhance the transverse shear flow across the substrate package 1204 as shown by a horizontal direction 1207 of the arrow in FIG. 12. For example, the transverse shear flow is in the direction 1207 that is parallel to a top surface of the substrate package 1204. The transverse shear flow is applied between the adjacent segments, such as the segments 116A and 116B, of the photoresist layer 112 to create the redistribution layer 120 (FIGS. 1B and 2B), the copper seed layer 304 (FIG. 3A), or the bulk copper layer 306 of the redistribution layer 312 (FIG. 3B).

Moreover, when the catholyte having copper and the leveler is introduced into the chamber 1220 on the substrate package 1204, the host computer 410 controls a direct current (DC) power source 1234 of the system 1200 to supply DC power to the counter electrode 1209 and to the wafer holder 1206. The wafer holder 1206 is positively charged by the DC power to serve as a cathode and the counter electrode 1209 is negatively charged by the DC power to serve as an anode to enable electrodeposition of ions of the catholyte onto the substrate package 1204.

Figure 13B:
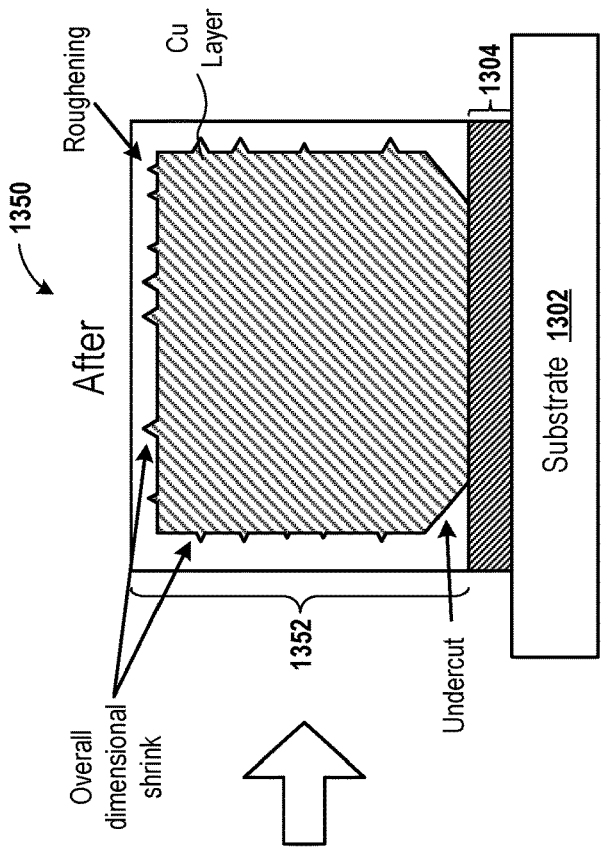
FIG. 13B is a diagram of an embodiment of a substrate package to illustrate benefits of not applying a barrier and seed layer to a substrate.
Figure 13A:
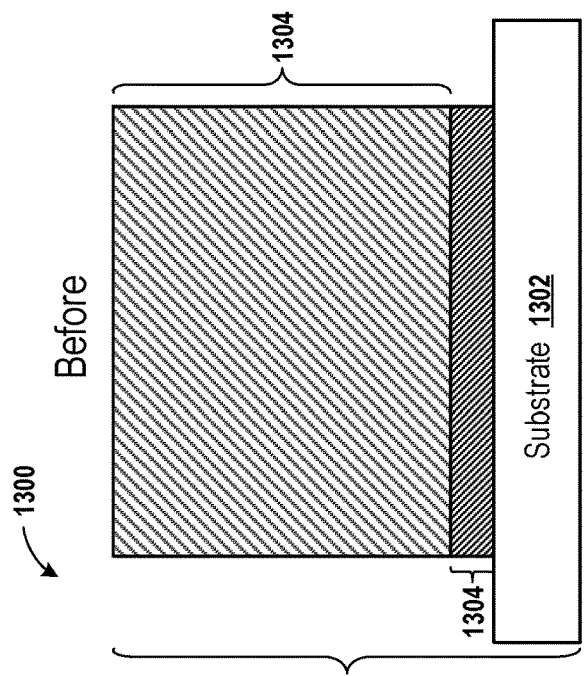
FIG. 13A is a diagram of an embodiment of a substrate package.

FIG. 13A is a diagram of an embodiment of a substrate package 1300 and the substrate package 1300 includes a substrate 1302. Multiple intermediate layers 1304 are deposited on top of the substrate 1302. For example, a barrier and seed layer, which is one of the intermediate layers 1304 are deposited on a top surface of the substrate 1302. The seed layer is fabricated from copper. An example of depositing the barrier and seed layer is provided in U.S. Patent Application Publication No. 2017-0243839, filed on Mar. 14, 2017, which is incorporated by reference herein in its entirety. Moreover, a redistribution layer 1304 is deposited on top of the intermediate layers 1304.

FIG. 13B is a diagram of an embodiment of a substrate package 1350 to illustrate benefits of not applying the barrier and seed layer to the substrate 102. The substrate package 1350 includes the substrate 1302, the intermediate layers 1304, and a roughened, undercut, and shrunk redistribution layer 1352. When the barrier and seed layer that is deposited is etched, the distribution layer 1304 is undercut, shrunk, and roughened by the etching. By avoiding the deposition of the barrier and seed layer, there is no etching performed of the barrier and seed layer. Accordingly, the redistribution layer 1304 is not damaged.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for fabrication of a redistribution layer (RDL) to minimize etching of the redistribution layer, comprising:
depositing a protective material on top of a substrate to overlay a top surface of the substrate with a protective layer;
overlaying a tungsten-based material on top of the protective layer to form a tungsten-based layer on top of the protective layer;
applying a metal-based material to the tungsten-based layer to generate a metal-based layer on top of the tungsten-based layer;
depositing a photoresist material on top of the metal-based layer to form a photoresist layer overlaid on the metal-based layer;
patterning the photoresist layer to create a plurality of vias between a plurality of segments of the photoresist layer;
applying copper on top of the plurality of vias to generate the redistribution layer such that a plurality of segments of the redistribution layer are intermittent with the plurality of segments of the photoresist layer;
stripping the plurality of segments of the photoresist layer after generating the redistribution layer, wherein said stripping is performed to access a plurality of portions of the metal-based layer;
etching the plurality of portions of the metal-based layer to access a plurality of portions of the tungsten-based layer and to minimize the etching of the redistribution layer; and
etching the plurality of portions of the tungsten-based layer to minimize the etching of the redistribution layer.

2. The method of claim 1, wherein the tungsten-based material is tungsten or tungsten nitride.

3. The method of claim 2, wherein the metal-based layer is nickel boride or cobalt.

4. The method of claim 1, wherein the substrate lacks an overlay of a barrier and seed layer to minimize the etching of the redistribution layer, wherein the etching of the redistribution layer occurs when the barrier and seed layer is etched.

5. The method of claim 1, wherein said applying the metal-based material is performed using electroless deposition.

6. The method of claim 1, wherein the protective layer includes an oxide or nitride and is formed using plasma enhanced chemical vapor deposition.

7. The method of claim 1, further comprising avoiding fabrication of a barrier layer and a seed layer between the substrate and the photoresist layer.

8. The method of claim 7, wherein the seed layer is made of copper, wherein etching of the seed layer etches at least a portion of the redistribution layer.

9. The method of claim 1, further comprising etching portions of the protective layer to access portions of the substrate.

10. A method for fabrication of a redistribution layer (RDL) to minimize etching of the redistribution layer, comprising:
depositing a protective material on top of a substrate to overlay a top surface of the substrate with a protective layer;
overlaying a metal-based material on top of the protective layer to form a metal-based layer on top of the protective layer;
depositing a photoresist material on top of the metal-based layer to form a photoresist layer overlaid on the metal-based layer;
patterning the photoresist layer to create a plurality of vias between a plurality of segments of the photoresist layer;
applying copper on top of the plurality of vias to generate the redistribution layer such that a plurality of segments of the redistribution layer are intermittent with the plurality of segments of the photoresist layer;
stripping the plurality of segments of the photoresist layer after generating the redistribution layer, wherein said stripping is performed to access a plurality of portions of the metal-based layer; and
etching the plurality of portions of the metal-based layer to minimize etching of the redistribution layer.

11. The method of claim 10, wherein the metal-based layer is fabricated from nickel boride or cobalt.

12. The method of claim 10, wherein the substrate lacks an overlay of a barrier and seed layer to minimize the etching of the redistribution layer, wherein the etching of the redistribution layer occurs when the barrier and seed layer is etched.

13. The method of claim 12, wherein the seed layer is made of copper, wherein etching of the seed layer etches at least a portion of the redistribution layer.

14. The method of claim 10, wherein said overlaying the metal-based layer is performed using electroless deposition.

15. The method of claim 10, wherein the protective layer includes an oxide or nitride and is formed using plasma enhanced chemical vapor deposition.

16. The method of claim 10, further comprising avoiding fabrication of a barrier layer and a seed layer between the substrate and the photoresist layer.

17. The method of claim 16, wherein the seed layer is made of copper, wherein etching of the seed layer etches at least a portion of the redistribution layer.

18. The method of claim 10, further comprising etching a plurality of portions of the protective layer to access a plurality of portions of the substrate.

19. A method for fabrication of a redistribution layer (RDL) to minimize etching of the redistribution layer, comprising:
depositing a protective material on top of a substrate to overlay a top surface of the substrate with a protective layer;
overlaying Ruthenium material on top of the protective layer to form a Ruthenium layer on top of the protective layer;
depositing a photoresist material on top of the Ruthenium layer to form a photoresist layer overlaid on the Ruthenium layer;
patterning the photoresist layer to create a plurality of vias between a plurality of segments of the photoresist layer;
applying a copper seed on top of the plurality of vias to generate a copper seed layer on top of the plurality of vias to initiate generation of the redistribution layer;
depositing bulk copper on top of the copper seed layer such that a plurality of segments of the redistribution layer are generated between the plurality of segments of the photoresist layer, wherein said depositing the bulk copper is performed to fabricate a bulk copper layer on top of the copper seed layer to fabricate the redistribution layer;
stripping the plurality of segments of the photoresist layer, wherein said stripping is performed to access a plurality of portions of the Ruthenium layer; and
etching the plurality of portions of the Ruthenium layer to minimize etching of the redistribution layer.

20. The method of claim 19, further comprising avoiding forming a barrier and seed layer on top of the substrate to minimize the etching of the redistribution layer.

21. The method of claim 20, wherein the seed layer is made of copper, wherein etching of the seed layer etches at least a portion of the redistribution layer.

22. The method of claim 19, wherein said overlaying the Ruthenium layer is performed using chemical vapor deposition.

23. The method of claim 19, wherein the protective layer includes an oxide or nitride and is formed using plasma enhanced chemical vapor deposition.

24. The method of claim 19, further comprising avoiding fabrication of a barrier layer and a seed layer between the substrate and the photoresist layer.

25. The method of claim 24, wherein the seed layer is made of copper, wherein etching of the seed layer etches at least a portion of the redistribution layer.

26. The method of claim 19, further comprising etching a plurality of portions of the protective layer to access portions of the substrate.

* * * * *